(12) United States Patent
Takizawa et al.

(10) Patent No.: US 7,915,646 B2
(45) Date of Patent: Mar. 29, 2011

(54) NITRIDE SEMICONDUCTOR MATERIAL, SEMICONDUCTOR ELEMENT, AND MANUFACTURING METHOD THEREOF

(75) Inventors: Toshiyuki Takizawa, Kyoto (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 548 days.

(21) Appl. No.: 11/738,655

(22) Filed: Apr. 23, 2007

(65) Prior Publication Data
US 2008/0121896 A1 May 29, 2008

(30) Foreign Application Priority Data
May 24, 2006 (JP) .................................. 2006-144701

(51) Int. Cl.
*H01L 29/778* (2006.01)
(52) U.S. Cl. .. 257/200; 257/194; 257/649; 257/E29.252
(58) Field of Classification Search .................. 257/192, 257/194, 200, 615, 640, 649, E29.144, E29.145, 257/E29.149, E29.246, E29.252
See application file for complete search history.

(56) References Cited

U.S. PATENT DOCUMENTS

| | | | |
|---|---|---|---|
| 7,045,404 B2* | 5/2006 | Sheppard et al. | 438/191 |
| 7,132,699 B2 | 11/2006 | Kimura et al. | |
| 7,592,211 B2* | 9/2009 | Sheppard et al. | 438/172 |
| 2004/0061129 A1* | 4/2004 | Saxler et al. | 257/192 |
| 2005/0106849 A1* | 5/2005 | Gwo | 438/602 |

FOREIGN PATENT DOCUMENTS
JP 2004-228481 8/2004

OTHER PUBLICATIONS

M. Higashiwaki et al., "Cat-CVD SiN-Passivated alGaN-GaN HFETs with Thin and High Al Composition Barrier Layers", IEEE Electron Device Letters, vol. 26, No. 3, pp. 139-141 (2005).
English language Abstract of JP 2004-228481.
M. Higashiwaki et al., "AlGaN/GaN Heterostructure Field-Effect Transistors with Current Gain Cut-Off Frequency of 152 GHz on Sapphire Substrates", Japanese Journal of Applied Physics, vol. 44, No. 16, pp. 475-478 (2005).

* cited by examiner

*Primary Examiner* — Anh Phung
*Assistant Examiner* — Michael Lulis
(74) *Attorney, Agent, or Firm* — Greenblum & Bernstein, P.L.C.

(57) ABSTRACT

The nitride semiconductor material according to the present invention includes a group III nitride semiconductor and a group IV nitride formed on the group III nitride semiconductor, where an interface between the group III nitride semiconductor and the group IV nitride has a regular atomic arrangement. Moreover, an arrangement of nitrogen atoms of the group IV nitride in the interface and an arrangement of group III atoms of the group III nitride semiconductor in the interface may be substantially identical.

16 Claims, 10 Drawing Sheets

FIG. 8C 801b
803
Fermi level
interface

FIG. 8D 801b
803
Fermi level
interface

NITRIDE SEMICONDUCTOR MATERIAL, SEMICONDUCTOR ELEMENT, AND MANUFACTURING METHOD THEREOF

BACKGROUND OF THE INVENTION (1) Field of the Invention

The present invention relates to a nitride semiconductor material, a semiconductor element, and a manufacturing method thereof. In particular, the present invention relates to a nitride semiconductor material and a semiconductor element which are made of a group III nitride semiconductor and a group IV nitride, and a manufacturing method thereof.

(2) Description of the Related Art

Recently, research and development of an electronic device such as a transistor made of a group III nitride semiconductor, for example, GaN is being widely carried out. Since a band gap of GaN is large, and a saturated drift velocity of the electron of GaN is high, GaN offers much promise for high power high frequency electron devices. For example, a semiconductor element that uses GaN is described in Japanese Laid-Open Patent Application No. 2004-228481. Moreover, it is reported that it is possible to obtain a large value of 152 GHz for a frequency cutoff $f_T$ in a high power high frequency electron device that uses GaN (refer to M. Higashiwaki, N. Hirose and T. Matsui, "Cat-CVD SiN-Passivated AlGaN—GaN HFETs with Thin and High Al Composition Barrier Layers", IEEE Electron Device Letters 26, 139, 2005, and M. Higashiwaki and T. Matsui, "AlGaN/GaN Heterostructure Field-Effect Transistors with Current Gain Cut-off Frequency of 152 GHz on Sapphire Substrates", Japanese Journal of Applied Physics 44, L475, 2005).

According to the above-mentioned two non-patent documents by M. Higashiwaki et al, by depositing a SiN film on a heterojunction of 10 nm thickness Al0.4Ga0.6N/1.3 nm thickness AlN/1.5 μm thickness using Cat-CVD (Catalytic Chemical Vapor Deposition), it is possible to increase sheet carrier density to $2.5 \times 10^{13}$ cm$^{-2}$ which is nearly three times that compared with a heterojunction when there is no SiN film. As a result, by greatly reducing sheet resistance between a source and a drain electrode and shortening the gate length to about 100 nm or less, it is possible to increase transconductance corresponding to the gain of a transistor to 400 mS/mm or more.

As mentioned above, a GaN-based transistor having excellent high frequency characteristics can be realized by passivating a thin film SiN on a GaN-based heterojunction transistor, forming a gate electrode thereon, and adopting an MIS (Metal-Insulator-Semiconductor) type transistor.

SUMMARY OF THE INVENTION

However, although excellent high frequency characteristics can be realized with the conventional semiconductor element such as a GaN-based MIS-type transistor, the mechanism for increasing carrier density is unclear. Accordingly, improvement of high frequency characteristics of a device, such as further increasing the carrier density and reducing sheet resistance, is difficult. In other words, with a conventional semiconductor element, it is difficult to design an optimal band structure for the performance characteristic of the element.

The present invention is conceived in view of the aforementioned problems and has as an object to provide a nitride semiconductor material and a semiconductor element which enable the designing of an optimal band structure for the behavior characteristics of the element, and a manufacturing method thereof.

In order to achieve the aforementioned object, the nitride semiconductor material according to the present invention includes: a group III nitride semiconductor; and a group IV nitride formed on said group III nitride semiconductor, wherein an interface between said group III nitride semiconductor and said group IV nitride has a regular atomic arrangement.

According to this configuration, since the group III nitride semiconductor and the group IV nitride are bonded by chemical bonding in the interface, excessive dangling bonds from the group III nitride semiconductor can be efficiently terminated. Therefore, the surface state which is a cause of degradation of element characteristics can be efficiently reduced. Moreover, since the group III nitride semiconductor and the group IV nitride are strongly bonded by the chemical bonding, the strain-induced stress from the group IV nitride can be efficiently imparted to the group III nitride semiconductor. Accordingly, the efficient modulation of the band structure of the nitride semiconductor element by stress becomes possible. In other words, by using the nitride semiconductor material according to the present invention, the design of an optimal band structure for the behavior characteristics of elements becomes possible.

Furthermore, it is also possible that an arrangement of nitrogen atoms of said group IV nitride in the interface and an arrangement of group III atoms of said group III nitride semiconductor in the interface are substantially identical.

According to this configuration, since the atomic arrangement of the group III nitride semiconductor and the group IV nitride is uniform in the interface, dangling bonds in the interface can be reduced, and the improvement of device characteristics and the reduction of characteristics variation can be achieved. Moreover, since the group III nitride semiconductor and the group IV nitride are bonded strongly by chemical bonding in the interface, the band structure of the group III nitride semiconductor can be efficiently modulated through the strain-induced stress of the group IV nitride. Therefore, the degree of freedom for device design can be improved by using the nitride semiconductor material according to the present invention.

Furthermore, it is also possible that the group IV nitride semiconductor has a beta-phase or a gamma-phase crystal structure in the interface.

According to this configuration, since a group IV nitride having a beta-phase structure or the gamma-phase structure with a high level of density and high level of hardness is formed in the interface, stress due to strain can be efficiently imparted to the group III nitride semiconductor via the interface, and device characteristics can be modulated with a high level of controllability.

Furthermore, it is also possible that the group III nitride semiconductor has a (0001) plane of a wurtzite structure or a (111) plane of a zinc-blende structure in the interface, the group IV nitride has a (0001) plane of a beta-phase crystal structure in the interface, a <11-20> direction of the (0001) plane of the wurtzite structure or a <11-2> direction of the (111) plane of the zinc-blende structure of said group III nitride semiconductor matches with a <11-20> direction of the (0001) plane of the beta-phase crystal structure of said group IV nitride, and a lattice constant of said group IV nitride is roughly twice a lattice constant of said group III nitride semiconductor.

According to this configuration, the atomic arrangement in the (0001) plane of the group IV nitride that is the beta-phase crystal is identical in symmetry to the atomic arrangement in the surface of the group III nitride semiconductor that has a (0001) plane of the wurtzite structure, and both having three-fold symmetry. In addition, when the <11-20> direction of the group III nitride semiconductor and the <11-20> direction of the group IV nitride match in the interface, since the atomic arrangements for same direction become uniform at the shortest cycle for both, dangling bonds in the interface can be drastically reduced, and the improvement of device characteristics and the reduction of characteristics variation can be achieved. Moreover, since strong bonding is possible in the interface, the band structure of the group III nitride semiconductor can be efficiently modulated through the strain-induced stress of the group IV nitride and, consequently, the degree of freedom for device design can be improved.

Furthermore, it is also possible that the group III nitride semiconductor has a (0001) plane of a wurtzite structure or a (111) plane of a zinc-blende structure in the interface, the group IV nitride has a (111) plane of a gamma-phase crystal structure in the interface, a <11-20> direction of the (0001) plane of the wurtzite structure or a <11-2> direction of the (111) plane of the zinc-blende structure of said group III nitride semiconductor matches with a <11-2> direction of the (111) plane of the gamma-phase crystal structure of said group IV nitride, and a lattice constant of said group IV nitride is roughly four times a lattice constant of said group III nitride semiconductor.

According to this configuration, the atomic arrangement in the (111) plane of the group IV nitride that is a gamma-phase crystal identical in symmetry to the atomic arrangement in the surface of the group III nitride semiconductor that has a (0001) plane of the wurtzite structure or the (111) plane of the zinc-blende structure, and both having three-fold symmetry. In addition, when the <11-20> direction of the group III nitride semiconductor (the <11-2> direction in case of the (111) plane of the zinc-blende structure) and the <11-20> direction of the group IV nitride match in the interface, since the atomic arrangements for same direction become uniform at the shortest cycle for both, dangling bonds in the interface can be drastically reduced, and the improvement of device characteristics and the reduction of characteristics variation can be achieved. Moreover, since strong bonding is possible in the interface, the band structure of the group III nitride semiconductor can be efficiently modulated through the strain-induced stress of the group IV nitride and, consequently, the degree of freedom for device design can be improved.

Furthermore, it is also possible that the group III nitride semiconductor has a (001) plane of the zinc-blende structure in the interface, and the group IV nitride has a (001) plane of the gamma-phase crystal structure in the interface.

According to this configuration, since the interface structure of the group IV nitride that has the (100) plane of the gamma-phase structure has lattice points that very closely resembles that of the group III nitride semiconductor that has the (100) plane of the zinc-blende structure, dangling bonds in the interface can be drastically reduced. As such, reduction of the interface state becomes possible, the improvement of device characteristics and the reduction of characteristics variation can be achieved. In addition, since the piezoelectric effect of the group III nitride semiconductor is small because of having the zinc-blende structure, the influence on device characteristics brought about by the strain from the group IV nitride is reduced. As such, the design freedom for the group IV nitride can be increased.

Furthermore, it is also possible that the group III nitride semiconductor has a (0001) plane of a wurtzite structure or a (111) plane of a zinc-blende structure in the interface, the group IV nitride has a (1-100) plane of a beta-phase crystal structure in the interface, and a <0001> direction of said group IV nitride in the interface is parallel to the interface.

According to this configuration, in the group IV nitride semiconductor that has the beta-phase structure, the surface which is orthogonal to the <0001> direction has a similar atomic arrangement to the surface of the group III nitride semiconductor that has the (111) plane of the zinc-blende structure or the (0001) plane of the wurtzite structure. Therefore, since the in-plane density of dangling bonds in the interface can be reduced, the improvement of device characteristics and the reduction of characteristics variation can be achieved. In addition, the group IV nitride that takes the beta-phase structure in the interface has a hexagonal structure, and mechanical characteristics are significantly different with the <0001> direction and a direction perpendicular thereto. Moreover, the stress imparted by the group III nitride semiconductor in the interface to the <0001> direction of the group IV nitride that takes the beta-phase structure, is different for the parallel in-plane direction and the perpendicular in-plane direction. As such, causing device characteristics modulation through stress only in the desired in-plane direction becomes possible, and the improvement of device characteristics and the reduction of characteristics variation can be achieved.

Furthermore, it is also possible that the group III nitride semiconductor includes: a first layer made of gallium nitride; and a second layer formed on said first layer, and made of a group III nitride semiconductor having a wide band gap compared to gallium nitride, and said group IV nitride is formed on said second layer.

According to this configuration, a two-dimensional electron gas is efficiently generated with the spontaneous polarization and the piezoelectric effect of the layer structure of the group III nitride semiconductor. In addition, the strain-induced stress from the group IV nitride insulation film can be efficiently imparted to the group III nitride semiconductor through the interface having regularly arranged atoms. Accordingly, since the band structure of the group III nitride semiconductor can be modulated, two-dimensional electron gas can be further efficiently obtained. Therefore, the influence on the device by the surface state can be relatively reduced. In particular, when the second layer contains aluminum as the group III element, conformity with the group IV nitride is significantly improved compared to when aluminum is not included, and a high-quality interface that is uniform in atomic order can be obtained. Therefore, the interface state can be significantly reduced.

Furthermore, it is also possible that in said group III nitride semiconductor, a trench is formed along an in-plane direction in the interface.

According to this configuration, the group III nitride semiconductor forms an excellent interface with the group IV nitride in the flat area without the trench. Therefore, the trap state due to dangling bonds can be reduced in the flat area of the group III nitride semiconductor. In addition, with the trench formed in the group III nitride semiconductor, it becomes possible to impart strain-induced stress on the flat area, and band modulation of the group III nitride semiconductor can effectively be put into use. Therefore, it becomes possible to increase degree of the design freedom of the device, and reduce the characteristics variation.

Furthermore, it is also possible that a trench is formed on a top surface of said group IV nitride, along an in-plane direction.

According to this configuration, the distribution of the strain-induced stress imparted to the group III nitride semiconductor is subjected to modulation according to the pattern processed into the group IV nitride. For example, assuming that the group IV nitride is of a material composition that imparts tensile strain to the group III nitride semiconductor, the group IV nitride in a flat area can impart large strain-induced stress to the group III nitride semiconductor via the interface, and can modulate the band downward. With this, sheet carrier density can be increased, and mobility can be improved due to the in-plane anisotropy of the strain. On the other hand, in the area having the trench, strain-induced stress is not present or is small. Therefore, since the band is raised by the in-plane strain-induced stress in the group III nitride semiconductor in the flat area and, consequently, the group III nitride semiconductor in the area having the trench undergoes depletion and electric current does not flow. As mentioned above, with the in-plane band modulation through the installation of the trench, increasing of sheet carrier density and the improvement of mobility can be achieved, and as a result, the improvement of the device characteristics can be achieved.

Furthermore, it is also possible that in said group III nitride semiconductor, an electrical conduction is an n-type, a lattice constant of said group IV nitride is large compared to a lattice match condition with said group III nitride semiconductor, in said group IV nitride, a hole which reaches the interface is formed, and said nitride semiconductor material further includes a conductive material connected with the interface via the hole.

According to this configuration, the group IV nitride imparts, via the interface, tensile strain in the in-plane direction to the part of the n-type group III nitride semiconductor which is directly under the group IV nitride. On the other hand, being subjected to compressive strain in the in-plane direction in the form of being dragged by the tensile strain, the n-type group III nitride semiconductor in the area where the group IV nitride does not exist on the surface can be modulated to an uneven strain distribution in the in-plane. This is because, the strain on the surface of the n-type group III nitride semiconductor is uniform when the group IV nitride doesn't exist, and when tensile strain is imparted on one part, the other areas, in comparison, are subjected to compressive strain. Therefore, the conduction band of the n-type group III nitride semiconductor in the area that is not subjected to compressive strain in the in-plane direction further shifts to the low energy side. Therefore, increasing the carrier density and the reduction of the electric resistance on the surface can be achieved. Moreover, low-resistance ohmic contact between the of the n-type group III nitride semiconductor and the conductive material can be achieved.

Furthermore, it is also possible that in said group III nitride semiconductor, an electrical conduction is a p-type, a lattice constant of said group IV nitride is small compared to a lattice match condition with said group III nitride semiconductor, in said group IV nitride, a hole which reaches the interface is formed, and said nitride semiconductor material further includes a conductive material connected with the interface via the hole.

According to this configuration, the group IV nitride imparts, via the interface, compressive strain in the in-plane direction to the part of the p-type group III nitride semiconductor which is directly under the group IV nitride. On the other hand, being subjected to tensile strain in the in-plane direction in the form of being dragged by the compressive strain, the p-type group III nitride semiconductor in the area where the group IV nitride does not exist on the surface can be modulated to an uneven strain distribution in the in-plane. This is because, the strain on the surface of the n-type group III nitride semiconductor is uniform when the group IV nitride doesn't exist, and when compressive strain is imparted on one part, the other areas, in comparison, are subjected to tensile strain. Therefore, the conduction band of the p-type group III nitride semiconductor in the area that is not subjected to tensile strain in the in-plane direction further shifts to the high energy side. Therefore, increasing the electron hole carrier density and the reduction of the electric resistance on the surface can be achieved. Moreover, low-resistance ohmic contact between the of the p-type group III nitride semiconductor and the conductive material can be achieved.

Furthermore, it is also possible that the nitride semiconductor material further includes a second group IV nitride formed on said group IV nitride, which is different in composition from said group IV nitride.

According to this configuration, since there is a structure having regularly arranged atoms in the interface, the second group IV nitride formed afterwards can also form an excellent film having regularity. Moreover, it is possible to impart strain-induced stress from the second group IV nitride to the group III nitride semiconductor, and control the band structure of the group III nitride semiconductor. Therefore, since the strain-induced stress for efficiently modulating the band structure of the group III nitride semiconductor can be imparted to the group IV nitride semiconductor while drastically decreasing the dangling bonds in the interface, it is possible to improve the reliability and the degree of freedom in design of the device.

Furthermore, it is also possible that the said group IV nitride is formed with a composition of a group IV element that does not impart strain-induced stress on said group III nitride semiconductor in the interface, and in said second group IV nitride, the composition is modulated to impart strain-induced stress on the interface in a vertical direction.

According to this configuration, the group IV nitride in the interface can achieve an interface, which has regularly arranged atoms, and which is most suitable for the surface structure of the group III nitride semiconductor without inducing an increase in internal energy originating from strain-induced stress. In other words, an interface with regularly arranged atoms can be easily obtained. Moreover, the nitride semiconductor material according to the present invention imparts strain-induced stress to the group III nitride semiconductor by modulating the composition of the second group IV nitride in the vertical direction with respect to the interface. Accordingly, the band structure of the group III nitride semiconductor can be modulated.

Furthermore, it is also possible that said group IV nitride contains a group IV element and nitrogen in a 3:4 ratio, and having a margin of error that is within 10 percent for composition of the group IV element and the nitrogen.

According to this configuration, since the group IV element and the nitrogen contained in the group IV nitride are bonded by a strong covalent bond, a hard crystalline structure can be achieved. Therefore, the strain-induced stress in the group IV nitride can be efficiently imparted to the group III nitride semiconductor via the interface. With this, it is possible to improve the characteristics of a device to which the nitride semiconductor material according to the present invention is introduced. Moreover, since the group IV nitride is structured with the covalent bond, compatibility with the group III nitride semiconductor is excellent, and the improvement of adhesion and the reduction of the interface state can be achieved.

Furthermore, it is also possible that said group IV nitride contains hydrogen.

According to this configuration, since the dangling bonds contained in the group IV nitride is termed by the hydrogen, the chemical stability and the insulation properties of the group IV nitride can be stabilized. Accordingly, the characteristics of the device which uses the nitride semiconductor material according to the present invention can be stabilized, and reliability can be improved.

Furthermore, it is also possible that the said group IV nitride semiconductor has a regular atomic arrangement throughout a whole area of said group IV nitride semiconductor.

According to this configuration, since the mechanical strength of the group IV nitride significantly enhanced, stress can be efficiently imparted to the group III nitride semiconductor via the interface. Moreover, when the group IV nitrides all have a crystal structure, there is a benefit of easy device design since the electronic structure is uniquely set.

Furthermore, it is also possible that the nitride semiconductor material further includes a second group III nitride semiconductor formed on said group IV nitride, wherein an interface between said second group III nitride semiconductor and said group IV nitride has a regular atomic arrangement.

According to this configuration, it is possible to achieve a group III nitride material in which the group IV nitride is in a sandwich structure with the group III nitride semiconductor. Since the band structure of the group IV nitride is on the high energy side overall compared to the III-nitride material, it becomes a type II heterojunction in the interface. And, when made in the sandwich structure, electrons spatially separate and are accumulated in the group III nitride semiconductor, and electron holes spatially separate and are accumulated in the group IV nitride. Moreover, because of the strain-induced stress due the high mechanical strength of the group IV nitride, the band structure of the sandwich structure is significantly tilted due to the piezoelectric effect. Moreover, because of the type II heterojunction in the interface, the energy gap between the accumulated electrons and electron holes can be made extremely small as compared to when materials are separate. Since this energy gap sharply changes with respect to the external electric field, an active wavelength filter element or an optical modulation element that can be driven with low voltage, and having a small parasitic capacitance can be achieved by using the nitride semiconductor according to the present invention.

Further, the semiconductor element according to the present invention includes: a group III nitride semiconductor; a group IV nitride formed on said group III nitride semiconductor; a source electrode formed on said group III nitride semiconductor; a drain electrode formed on said group III nitride semiconductor, opposite said source electrode; and a gate electrode formed on said group IV nitride, between said source electrode and said drain electrode, wherein an interface between said group III nitride semiconductor and said group IV nitride has a regular atomic arrangement.

According to this configuration, since the group III nitride semiconductor and the group IV nitride are bonded by chemical bonding in the interface, excessive dangling bonds from the group III nitride semiconductor can be efficiently terminated. Therefore, the surface state which is a cause of degradation of element characteristics can be efficiently reduced. Moreover, since the group III nitride semiconductor and the group IV nitride are strongly bonded by the chemical bonding, the strain-induced stress from the group IV nitride can be efficiently imparted to the group III nitride semiconductor. Accordingly, the efficient modulation of the band structure of the nitride semiconductor element by stress becomes possible. In other words, the semiconductor element according to the present invention allows the design of an optimal band structure for the behavior characteristics of elements.

Furthermore, the method of manufacturing a nitride semiconductor material according to the present invention includes steps of: performing crystal growing of a group III nitride semiconductor on a semiconductor substrate, in a furnace, by Metal Organic Chemical Vapor Deposition; and forming a group IV nitride on the group III nitride semiconductor without extracting the semiconductor substrate from the furnace, the group IV nitride causing, through thermal decomposition reaction, an interface with said group III nitride semiconductor to have a regular atomic arrangement.

Accordingly, by depositing the group IV nitride without extraction from the furnace, mixing-in of impurities such as oxygen in the interface between the group IV nitride and the group III nitride semiconductor can be suppressed to a minimum, and irregularities in the interface caused by impurities can be controlled. Moreover, by depositing the group IV nitride by thermal decomposition reaction, atomic migration in the interface can be promoted. Accordingly, the two-dimensional growth of the group IV nitride can be promoted while suppressing the three-dimensional growth of the group IV nitride.

The present invention can provide a nitride semiconductor material and a semiconductor element which enable the designing of an optimal band structure for the behavior characteristics of the element, and a manufacturing method thereof.

FURTHER INFORMATION ABOUT TECHNICAL BACKGROUND TO THIS APPLICATION

The disclosure of Japanese Patent Application No. 2006-144701 filed on May 24, 2006 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 8A is a diagram schematically showing the cross-sectional configuration of the electrode contact layer according to the fourth embodiment of the present invention;

FIG. 8B is a diagram schematically showing the cross-sectional configuration of the electrode contact layer according to the fourth embodiment of the present invention;

FIG. 8C is a diagram schematically showing the band structure of the electrode contact layer according to the fourth embodiment of the present invention;

FIG. 8D is a diagram schematically showing the band structure of the electrode contact layer according to the fourth embodiment of the present invention;

DESCRIPTION OF THE PREFERRED EMBODIMENT(S)

Hereafter, the best mode for implementing the present invention will be explained with reference to the drawings.

First Embodiment

In the first embodiment of the present invention, a manufacturing method of a semiconductor element that uses a nitride semiconductor material in which an interface between a group III nitride semiconductor and a group IV nitride becomes a regular atomic arrangement will be explained.

The semiconductor element that uses the nitride semiconductor material according to the first embodiment of the present invention is formed by using crystal growth technology. In the semiconductor element that uses the nitride semiconductor material according to the first embodiment, group III raw material of the group III nitride semiconductor uses trimethyl gallium (hereafter, called TMG) for example as a gallium raw material, trimethyl aluminum (hereafter, called TMA) for example as an aluminum raw material, and trimethyl indium (hereafter, called TMI) for example as an indium raw material. Moreover, as a group V raw material, ammonia (hereafter, called $NH_3$) for example is used as a nitrogen raw material. The crystal growing is performed by Metal Organic Chemical Vapor Deposition method (hereafter, called MOCVD method) of doping an n-type semiconductor layer, with Si using silane (hereafter, called $SiH_4$) for example as an impurity raw material. Moreover, crystal growing is performed by the MOCVD method of doping a p-type semiconductor layer with Mg using cyclopentadienyl magnesium (hereafter, called $CP_2Mg$) for example.

FIG. 1A, FIG. 1B, FIG. 1C, and FIG. 1D are cross-sectional drawings showing the manufacturing process of a heterojunction field-effect transistor which is the semiconductor element that uses the nitride semiconductor material according to the first embodiment of the present invention.

First, a 1.5-micron thick undoped GaN layer 102 that is a group III nitride semiconductor is formed, by crystal growing, on a (0001) plane of a GaN substrate 101 that is a group III nitride semiconductor. Further, an 8 nm thick n-type AlGaN layer 103, which is a group III nitride semiconductor having a wide band gap compared to gallium nitride (GaN), is formed, by crystal growing, on the GaN layer 102. And then, a 1 nm thick AlN layer 104 that is a group III nitride semiconductor is formed, by crystal growing, on the n-type AlGaN layer 103 to improve conformity with a group IV nitride (FIG. 1A).

Figure 1A:
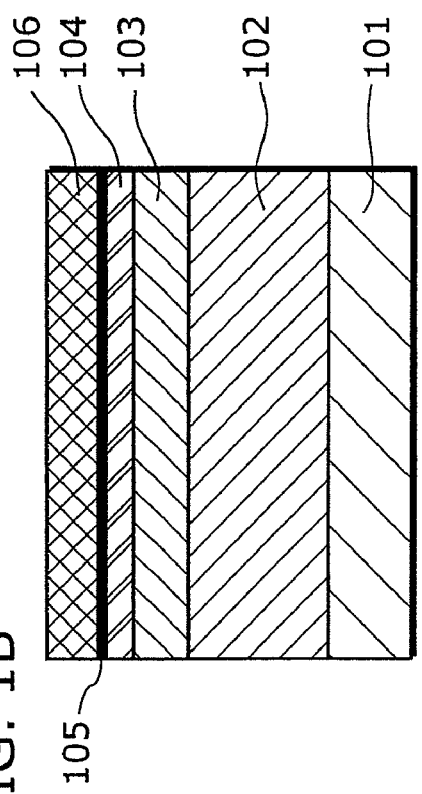
FIG. 1A is a cross-sectional drawing showing of the manufacturing process of a semiconductor element that uses the nitride semiconductor material according to the first embodiment of the present invention.
Figure 1C:
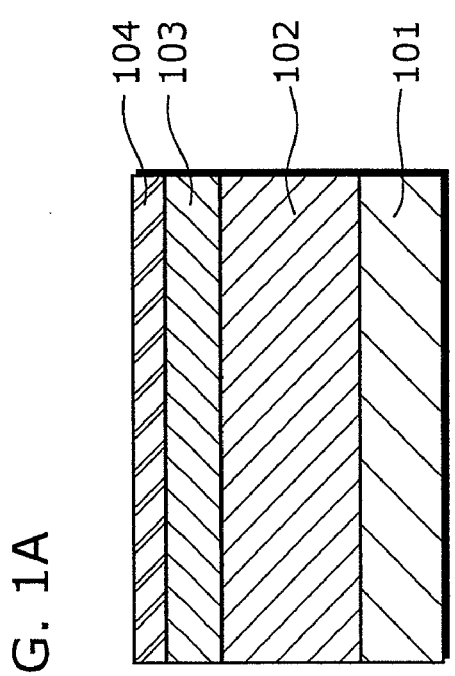
FIG. 1C is a cross-sectional drawing showing of the manufacturing process of a semiconductor element that uses the nitride semiconductor material according to the first embodiment of the present invention.
Figure 1B:
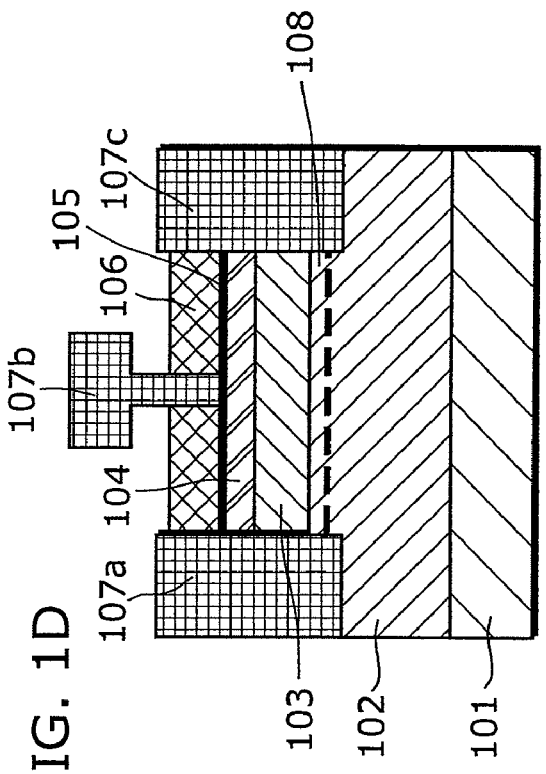
FIG. 1B is a cross-sectional drawing showing of the manufacturing process of a semiconductor element that uses the nitride semiconductor material according to the first embodiment of the present invention.

Next, a silicon nitride film 106 that is the group IV nitride is formed on the AlN layer 104 shown in FIG. 1A, via an interface 105 (FIG. 1B). An MOCVD apparatus used for the film deposition of the group III nitride semiconductor (GaN layer 102, n-type Al GaN layer 103, and AlN layer 104) is used for the film deposition of the silicon nitride film 106. Moreover, $SiH_4$ gas and $NH_3$ gas are used as the source gas for silicon and nitrogen respectively. Therefore, the silicon nitride film 106 can be deposited successively after the group III nitride semiconductor is deposited, without extracting the substrate from the furnace. As a result, impurities such as oxygen are not mixed-in in the interface 105 of the n-type AlGaN layer 103 and the silicon nitride film 106, and the interface 105 is controlled excellently. An interface state pinning the band of the group III nitride semiconductor can be eliminated from the interface by the prevention of oxygen from existing in the interface 105 or by making the in-surface density equal to or less than $10^{14}$ per square centimeter. Accordingly, it is possible to stabilize the characteristics and improve the reliability of a device that uses the nitride semiconductor material according to the present invention.

In the first embodiment, common gaseous deposition condition such as decomposition of raw materials using plasma and low film deposition temperature are not used, and the film deposition of the silicon nitride film 106 is performed through the thermal decomposition reaction on the surface when the growing temperature is raised to 800 degrees centigrade or more. By not using plasma as well as by drastically increasing the growing temperature compared to what is conventional, it is possible to perform thermal decomposition on $NH_3$ and obtain activated nitrogen atoms, and promote atomic migration in the interface. Accordingly, the two-dimensional growth of the silicon nitride can be promoted while controlling the three-dimensional growth of the silicon nitride. Furthermore, in the first embodiment, the silicon nitride film 106 is deposited with a deposition rate which is significantly lowered to about 1 nm per hour, which is nearly a hundred times slower than conventional, for precise interface control. By depositing the silicon nitride film 106 under the above-mentioned deposition condition, the silicon nitride film 106 of a homogeneous beta-phase structure can be deposited. By using this growing method, impurities such as oxygen and carbon are not mixed with the atoms making up the silicon nitride film 106 in the interface 105, and the interface 105 has a regular atomic arrangement. Moreover, atoms making up the silicon nitride film 106 in the interface 105 chemically bonds to the AlN layer 104 so as to reduce dangling bonds. An interface state pinning the band of the group III nitride semiconductor can be eliminated from the interface by the prevention of oxygen from existing in the interface 105 or by making the in-surface density equal to or less than $10^{14}$ per square centimeter. Accordingly, it is possible to stabilize the characteristics and improve the reliability of a device that uses the nitride semiconductor material according to the present invention.

After the silicon nitride film 106 that is a group IV nitride is deposited, a hole for a gate electrode, a source electrode, and a drain electrode is formed in the silicon nitride film 106 by dielectric reactive ion etching using $CF_4$ gas. The reason for forming the hole for the gate electrode in the silicon nitride film 106 is to reduce parasitic capacitance and increase transconductance. Further, by etching the AlN layer 104, the n-type AlGaN layer 103, and the undoped GaN layer 102 using chlorine-based dry etching, an area for electrical conduction via the source electrode and the drain electrode is formed (FIG. 5C).

Figure 1D:
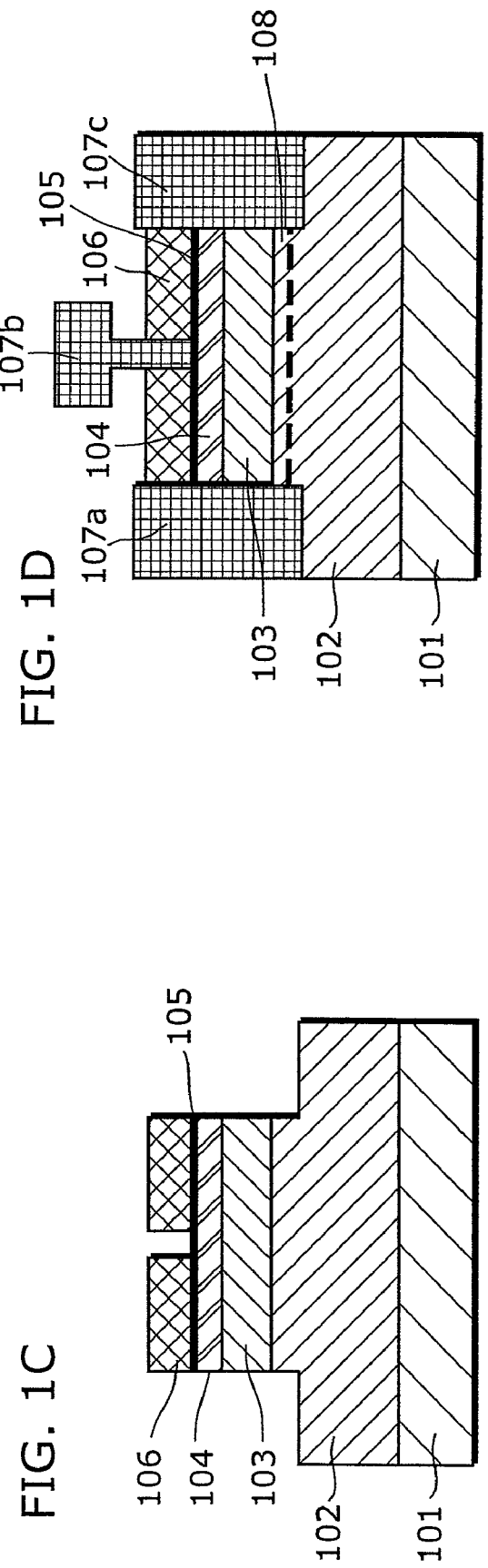
FIG. 1D is a cross-sectional drawing showing of the manufacturing process of a semiconductor element that uses the nitride semiconductor material according to the first embodiment of the present invention.

Next, a source electrode 107a, a gate electrode 107b, and a drain electrode 107c are formed by vapor deposition of an electrode of titanium/aluminum/titanium/gold on the structure shown in FIG. 5C using the lift-off method (FIG. 1D). With this, a heterojunction field-effect transistor is formed.

The heterojunction field-effect transistor shown in FIG. 1D is regularly arranged by the atomic order in the interface 105, and the AlN layer 104 and the silicon nitride film 106 are connected by chemical bonding. Accordingly, the interface state in the interface 105 can be reduced. Further, the silicon nitride film 106 can impart the strain-induced stress to the AlN layer 104, through the chemical bonding in the interface 105. As a result, the sheet carrier density of two-dimensional electron gas 108 generated in the GaN layer 102 can be modulated. Accordingly, the sheet resistance between the source electrode 107a and the drain electrode 107c can be decreased. Thus, the characteristics and the reliability of the heterojunction field-effect transistor can be improved by using the group IV nitride having atoms that are in a regular arrangement in, at least, the interface.

Moreover, the heterojunction field-effect transistor shown in FIG. 1D has the three-layer structure of the GaN layer 102, the n-type AlGaN layer 103, and the AlN layer 104. Accordingly, two-dimensional electron gas can be efficiently generated with the spontaneous polarization and the piezoelectric effect.

In the first embodiment, although it is assumed that the layer structure of the group III nitride semiconductor is the heterojunction of the undoped GaN layer 102, the n-type AlGaN layer 103 and the AlN layer 104, a combination of group III nitride semiconductors aside from this is also possible. Moreover, the group III nitride semiconductor may be a monolayer structure.

Moreover, when the crystallinity and flatness of the GaN substrate 101 are excellent, the undoped GaN layer 102 and the GaN substrate 101 may be one and the same, and the n-type AlGaN layer 103 may be formed directly on the n-type GaN substrate 101. In this case, since crystal growing is decreased by one layer, the nitride semiconductor material can be realized at an even lower cost. Moreover, the effectiveness of the present invention can be demonstrated even if the crystal structure of the GaN substrate 101, the undoped GaN layer 102, the n-type AlGaN layer 103, and the AlN layer 104 is a wurtzite structure or a zinc-blende structure.

Moreover, although the MOCVD method is used as the method for forming the silicon nitride film 106 in the above-mentioned explanation, as long as atoms are regularly arranged in the interface 105, any deposition method is acceptable. There is a method of creating the silicon nitride film 106 by using the molecular beam epitaxy technique as a deposition method other than the MOCVD method. In this case, the silicon nitride film 106 can be deposited on the group III nitride semiconductor by making solid silicon into an atomic beam through electron beam irradiation under an atmosphere having atomic nitrogen created by transforming nitrogen gas into plasma, and supplying the atomic beam. By assuming the beam flux pressure of silicon to be about $1 \times 10^{-5}$ Torr, the amount of the nitrogen flow to be 1 sccm, and the incident high-frequency power for transforming nitrogen into plasma to be 290 W, as specific deposition conditions, and forming the silicon nitride film 106 using the molecular beam epitaxy technique with a 700-degree centigrade substrate temperature, a silicon nitride film 106 having an excellent interface 105 can be obtained. Moreover, in order to remove the ion component of atomic nitrogen that causes damage to the interface 105, +200V is applied as a reverse bias, and the flying atomic nitrogen is made into a radical element that is electrically neutral. Moreover, in the case of depositing by the molecular beam epitaxy technique, since it is possible to deposit by in situ observation using Reflection High-Energy Electron Diffraction (RHEED) image, the interface 105 can be controlled with high accuracy. Moreover, since impurities (oxygen, carbon and so forth) on the surface can be removed by irradiating low power (about 150 W) nitrogen plasma for 30 minutes at 700-degree centigrade substrate temperature before the silicon nitride film 106 is deposited, it is possible to realize a group IV nitride that has the interface 105 in which atoms without impurities are regularly arranged.

Moreover, although the beta-phase structure is obtained as a crystal structure by depositing the silicon nitride film 106 at a 800-degree centigrade deposition temperature in the above-mentioned explanation, a harder, more high-density gamma-phase structure can be homogeneously deposited by setting the growing temperature at 1000 degrees centigrade or more.

Here, the atomic composition ratio of silicon and nitrogen is 3:4 for the silicon nitride film 106. At this time, in the silicon nitride film 106, both atoms making up the group IV nitride are bonded through covalent bonding. In particular, when the composition margin of error is within 10%, a strong and chemically stable film can be realized. Accordingly, the strain-induced stress in the silicon nitride film 106 can be efficiently imparted to the AlN layer 104 via the interface 105. Moreover, since the silicon nitride film 106 is configured by covalent bonding, compatibility with a group III nitride semiconductor such as the AlN layer 104 is good, and the improvement of adhesion and the reduction of the interface state can be achieved. In particular, it is understood as a result of the analysis by the first principle calculation that we performed that, in introducing the AlN layer 104 directly under of the silicon nitride film 106, AlN conforms well with silicon nitride as compared to GaN, and a silicon nitride thin film is formed in such a manner as to cover up the surface of the AlN layer 104. Deposition of the AlN layer 104 means the interface 105 with the silicon nitride film 106 is of high quality.

Moreover, even if the atomic composition ratio of silicon and nitrogen deviates from 3:4, the effect of the present invention is produced when dangling bonds terminate with hydrogen. In other words, when the silicon nitride film 106, which is a group IV nitride, contains hydrogen and the dangling bonds terminate with hydrogen, the same effect can be attained as in the case where the atomic composition ratio of silicon and nitrogen is 3:4. A specific and effective method for terminating the dangling bonds with hydrogen achieves this by using a compound that includes one NH bond as a nitrogen source. For example, it is effective to use a nitrogen source ($(CH_3)_2N$) that substitutes two hydrogen atoms of $NH_3$ for methyl radicals. When ($(CH_3)_2N$) is used, first, two methyl radicals are liberated due to heat on the substrate surface that is heated to 700 degrees centigrade, and NH is generated. Since NH is chemically unstable, NH bonds quickly with the growing surface of the group IV nitride, while maintaining the NH bond. And then, when a group IV element comes to the periphery of the NH bond, nitrogen parts with the hydrogen atom, and chemically bonds with the group IV element. Here, when the group IV nitride is formed under a condition in which the atomic composition ratio of the group IV element and nitrogen deviates from 3:4, the hydrogen atom remains in the group IV nitride with the NH bond maintained, and seals the dangling bond. When annealing is performed at high temperature after the group IV nitride is formed, hydrogen is desorbed, and the group IV nitride is changed into a structure with higher crystallinity. Moreover, even when dangling bonds are generated in the structure change, dangling bonds are reduced automatically since hydrogen desorbed from other sites bond again. Thus, by using ($(CH_3)_2N$) when the atomic composition ratio of silicon and nitrogen deviates from 3:4, dangling bonds can be termined with hydrogen.

Moreover, although the hole for the gate electrode is formed in the silicon nitride film 106 in FIG. 5C, the effectiveness of the present invention can be demonstrated even without forming the hole. In this case, since the etching step is omitted, the process can be simplified.

Moreover, although the effectiveness of the present invention is demonstrated when atoms are regularly arranged in the interface 105 periphery in the crystal structure of the silicon nitride film 106, it goes without saying that the effectiveness of the present invention is demonstrated even in the case where there is a regular atomic arrangement, not only in the interface 105, but in the whole area of the silicon nitride film 106. When the regular atomic arrangement is formed in the whole area of the silicon nitride film 106, the mechanical strength of the silicon nitride film 106 greatly increases, and thus, it becomes possible to efficiently impart stress to the AlN layer 104 via the interface 105. Moreover, since the electronic structure of the silicon nitride film 106 is uniquely set, there is a benefit of easy device design.

Second Embodiment

In the second embodiment of the present invention, explanation is carried out regarding an interface structure for the precise controlling of dangling bonds for the purpose of improving the degree of freedom in materials design in the combination of a group III nitride semiconductor and various group IV nitrides, and efficiently imparting strain-induced stress.

Figure 2:
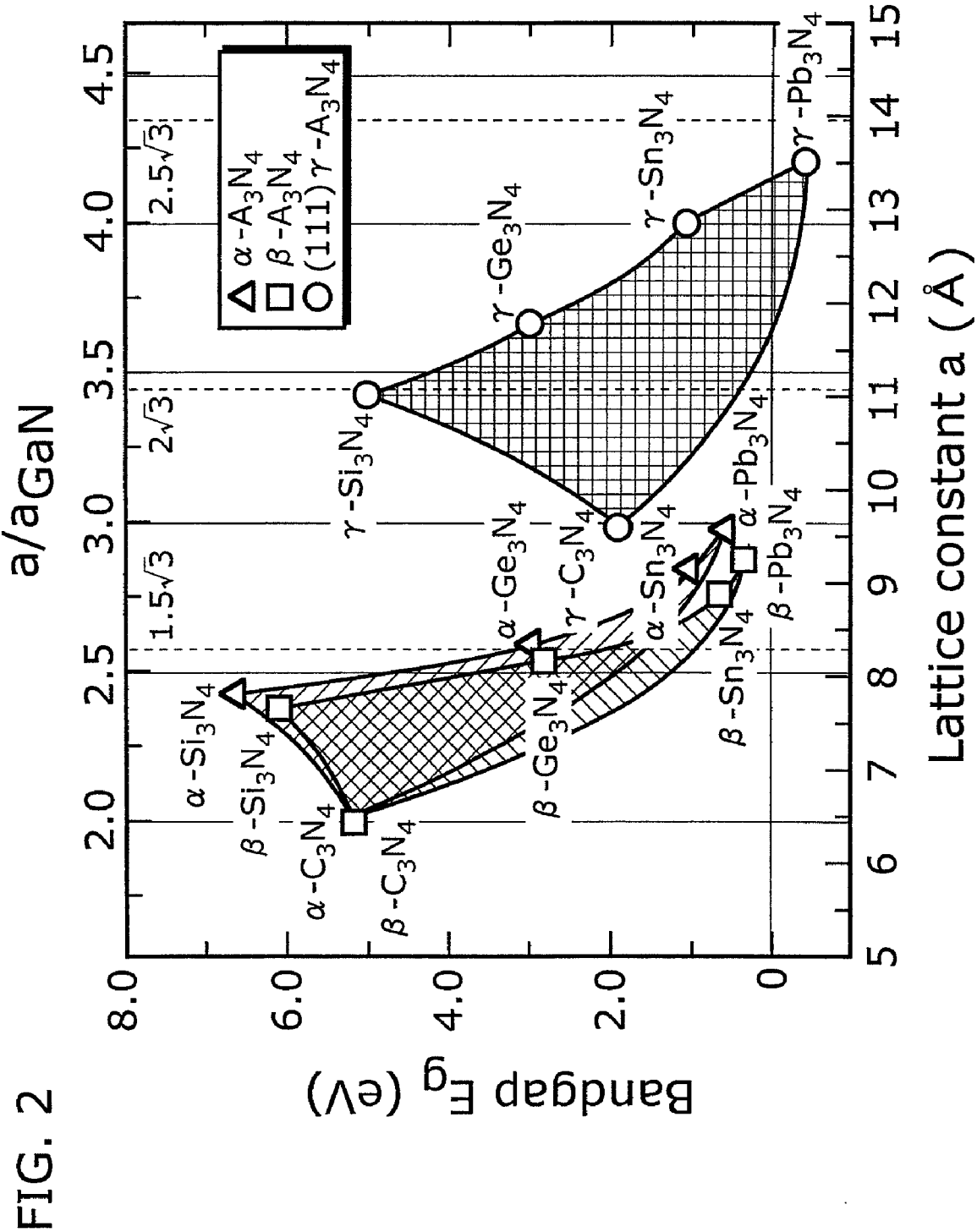
FIG. 2 is a diagram showing the relation between the lattice constant and the band gap in each composition and crystal phase of a group IV nitride.

The lattice constant and the band gap of the group IV nitride can be freely designed by including one or more of carbon, silicon, germanium, tin, and lead, as the group IV element. We obtained, through first principle calculation, the relation between the lattice constant and the band gap when various group IV elements are used in the group IV nitride. The result is shown in FIG. 2. FIG. 2 is a diagram showing the relation between the lattice constant and the band gap in three crystal structures (alpha-phase structure, beta-phase structure, and gamma-phase structure) taken by the group IV nitride. By modulating the composition of the group IV element, the physical properties of the group IV nitride can be freely designed within the range shown in the shaded portion in FIG. 2. For example, by using lead azide from carbon nitride as a group IV nitride material and selecting an appropriate crystal structure, the lattice constant can be changed from −16% to +21% with respect to the lattice constant of silicon nitride. Moreover, changing the band gap from the metal (negative band gap) to about 6.4 eV becomes possible. Accordingly, it becomes possible to dramatically improve the degree of freedom in the design of materials.

The vertical lines drawn with solid lines in FIG. 2 show half-integer multiples of a lattice constant for the lattice constant of GaN. Here, the <11-20> direction of GaN and <11-20> direction of nitride of the group IV (<11-2> direction for the gamma-phase) match each other in an in-plane of the interface. The group IV nitride conforming to these vertical lines shown in FIG. 2 have a periodic arrangement for GaN, in the ratio shown in the upper row horizontal axis. As shown in FIG. 2, alpha-phase carbon nitride (alpha-$C_3N_4$) and beta-phase carbon nitride (beta-$C_3N_4$) approximately match twice the lattice constant of GaN. Moreover, beta-phase germanium nitride (beta-$Ge_3N_4$) approximately matches 2.5 times the lattice constant of GaN. Gamma-phase carbon nitride (gamma-$C_3N_4$) approximately matches three times the lattice constant of GaN. Gamma-phase tin nitride (gamma-$Sn_3N_4$) approximately matches four times the lattice constant of GaN.

Moreover, the vertical lines drawn in dotted lines in FIG. 2 show a lattice constant that is a multiple with respect to sin (60°) GaN lattice constant. At this time, the <11-20> direction of GaN and the <11-20> direction of the group IV nitride (<11-2> direction for the gamma-phase) are orthogonally arranged in the in-plane of the interface. The group IV nitride conforming with the dotted vertical lines shown in FIG. 2 has good conformity with the surface of GaN, and perform regular chemical bonding. As shown in FIG. 2, alpha-phase germanium nitride (alpha-$Ge_3N_4$) and beta-phase germanium nitride (beta-$Ge_3N_4$) approximately match 1.5√3 times of the GaN lattice constant. Moreover, gamma-phase silicon nitride (gamma-$Si_3N_4$) approximately matches 2√3 times of the GaN lattice constant.

Various combinations occur in the regular atomic arrangement and the chemical bonding in the interface between the group III nitride semiconductor and the group IV nitride depending on the selection of the composition and the crystal phase of the group III nitride semiconductor and the group IV nitride. The number of dangling bonds in the interface can be reduced by selecting the composition and the crystalline phase of the group III nitride semiconductor and the group IV nitride by which the arrangement of the nitrogen atoms of the group IV nitride in the interface between the group III nitride semiconductor and the group IV nitride and the arrangement of the group III atoms of the group III nitride semiconductor in the interface substantially become identical. In particular, the beta-phase and the gamma-phase, from among the three crystal phases that can be taken by the group IV nitride can further reduce dangling bonds in the interface. The (0001) plane of the beta-phase, in particular, can best reduce the number of dangling bonds when the lattice constant increases to twice that of the (0001) plane of the group III nitride semiconductor, and the number of dangling bonds can be reduced to almost 0. On the other hand, with regard to the (111) plane of the gamma-phase, when the in-plane <11-2> direction in of the interface and the plane direction <11-20> of the (0001) plane of the group III nitride semiconductor are parallel, the number of dangling bonds can be reduced most in the case where the lattice constant is four times the lattice constant of the group III nitride semiconductor.

Four examples of specific interface structures between GaN and the group IV nitride will be explained as follows.

First, the first example of the interface structure between GaN and the group IV nitride will be explained.

Figure 3A:
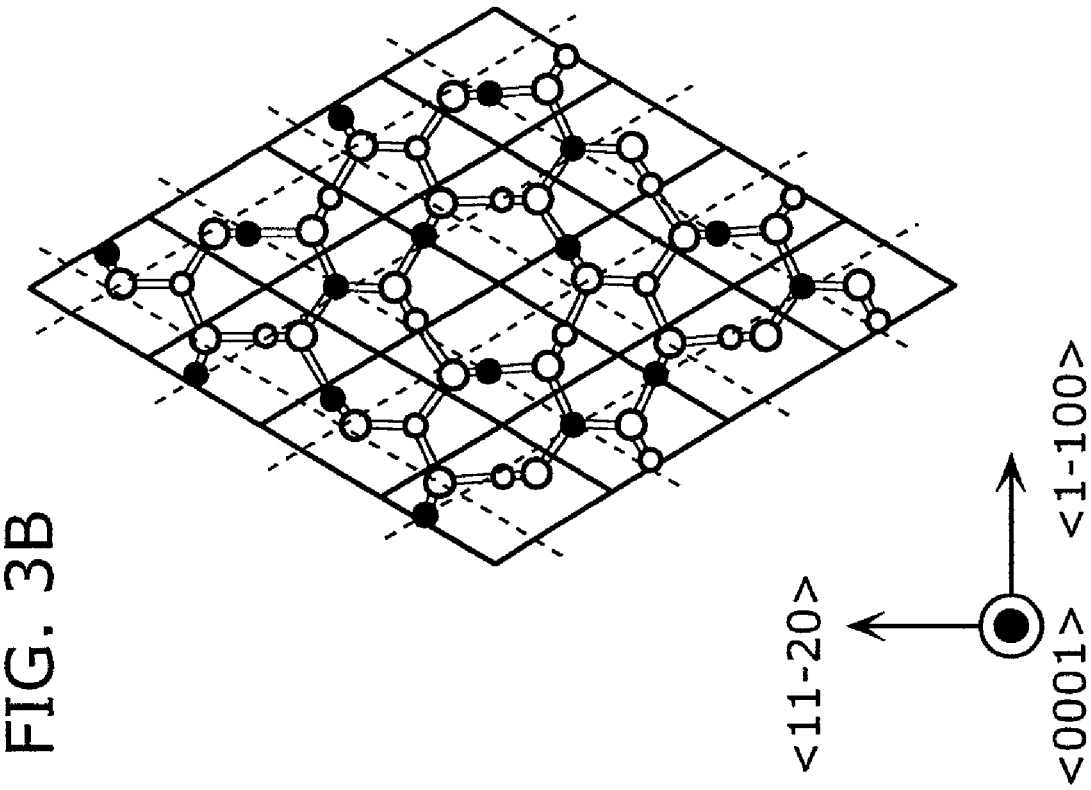
FIG. 3A is a diagram schematically showing the atomic arrangement of the (0001) plane of the wurtzite structure group III nitride semiconductor.
Figure 3B:
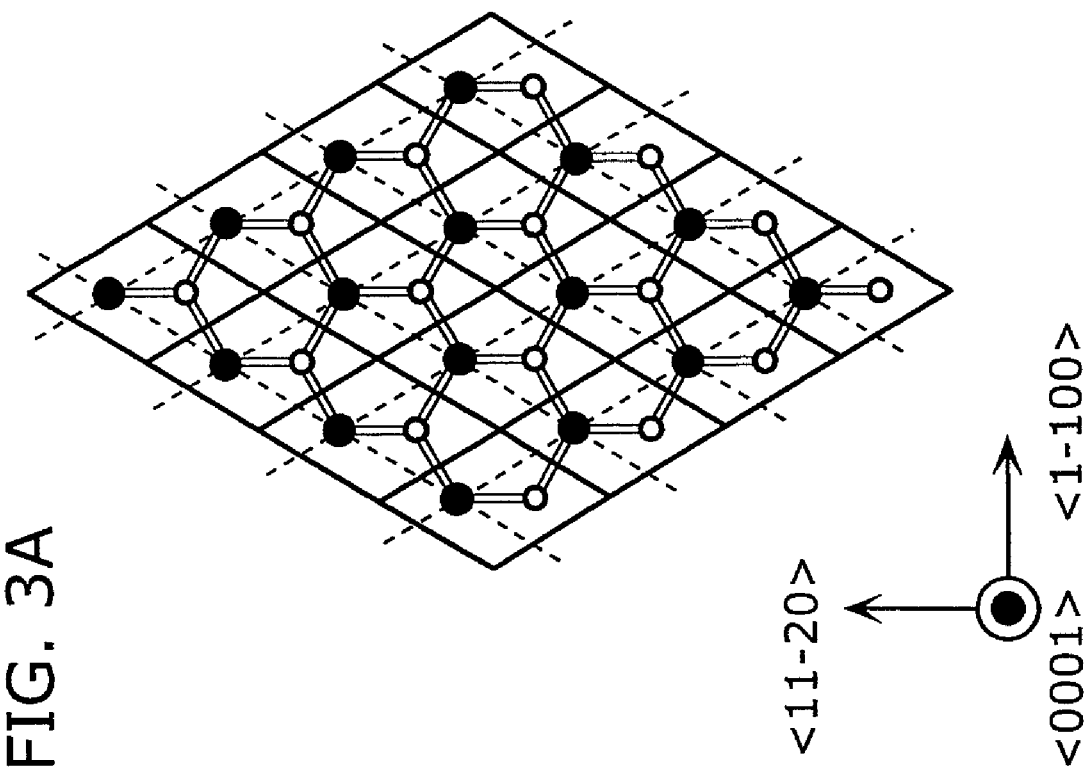
FIG. 3B is a diagram schematically showing the atomic arrangement of the (0001) plane of the beta-phase structure group IV nitride.

FIG. 3A is a diagram showing the atomic arrangement of the (0001) plane of the wurtzite group III nitride semiconductor (corresponding to the (111) plane of the zinc-blende structure). FIG. 3B is a diagram showing the atomic arrangement of the (0001) plane of the group IV nitride taking the beta-phase structure. In FIG. 3A and FIG. 3B, the lattice constant of the group IV nitride is depicted as being twice that of the group III nitride semiconductor. In FIG. 3A, a large black circle indicates a group III atom and a small white circle indicates a nitrogen atom. In particular, a large black circle indicates a group III atom that exists on the top-most surface (interface between the group III nitride semiconductor and the group IV nitride). On the other hand, in FIG. 3B, a large circle indicates a group IV atom and a small circle indicates a nitrogen atom. In particular, a small black circle indicates a nitrogen atom that exists in the bottom-most layer (vicinity of the interface between the group III nitride semiconductor and the group IV nitride). In FIG. 3A and FIG. 3B, a solid line diamond shows a unit cell. Here, the unit cell of the group IV nitride of the beta-phase structure in FIG. 3B is conformed so as to be twice the unit cell of the group III nitride semiconductor in FIG. 3A. Moreover, in FIG. 3A and FIG. 3B, the upward direction is assumed to be the <11-20> direction of the group III nitride semiconductor, and the <11-20> direction of the group III nitride semiconductor and the <11-20> direction of nitride of the beta-phase group IV match each other. In FIG. 3A, a connection with the group III atom on the top-most surface is indicated by broken lines, and the group III atom exists in the intersection of the broken lines. Moreover, broken lines of the same spacing as in FIG. 3A are shown in FIG. 3B, for comparison.

The case where the group IV nitride of the beta-phase structure shown in FIG. 3B is formed, by crystal growing, on the group III nitride semiconductor shown in FIG. 3A is considered below. At this time, as shown in FIG. 3B, the nitrogen atom located in the bottom-most layer of the beta-phase structure group IV nitride structure has a one-to-one relation and exists, though with slight strain, in the location of the top-most surface group III atom of the group III nitride semiconductor shown at the intersection of dotted line. Since the group III atoms and nitrogen atoms cause one-to-one chemical bonding, no dangling bond exists in the interface. Therefore, it becomes possible to reduce interface state generation to a minimum. Thus, when (1) the lattice constant of the group IV nitride that is a beta-phase structure is approximately twice the lattice constant of the group III nitride semiconductor, (2) the group III nitride semiconductor has a (0001) plane of the wurtzite structure or (111) plane of the zinc-blende structure, and the plane direction of the group IV nitride is the (0001) plane, and (3) the in-plane direction in the interface of the group III nitride semiconductor is <11-20>, and the plane direction of the group IV nitride of the beta-phase structure is <11-20>, a consistent interface with no dangling bonds can be realized.

Here, the group IV nitride having the beta-phase structure can be obtained at a comparatively low temperature of about 800 degrees centigrade, and can assume the beta-phase structure autonomously by using the nitrogen atom of the bottom-most layer as a foundation. This is because the orbit extents almost downward for the electron of the nitrogen atom of the beta-phase structure in the bottom-most layer. On the other hand, when nitrogen is adsorbed in the group III atom that is the top-most surface of the (0001) plane of the group III nitride semiconductor, the consistency in the interface is maintained since the nitrogen atom is adsorbed in a vertical direction. Moreover, when the deposition of the group IV nitride of the beta-phase structure advances, and a complete beta-phase crystal structure is constructed, structure relaxation takes place although there is strain in the nitrogen atoms in the interface. As shown in FIG. 3B, this is because the location of the bottom-most layer nitrogen atom in the beta-phase structure deviates from the location of the group III element shown in FIG. 3A. Such atomic order strain contributes to the modulation of the band structure on the surface of the group III nitride semiconductor without increasing the interface state and, since the distordion from the crystal of the group IV nitride is added, modulation of the band structure can be further promoted. Therefore, by forming a <11-20> direction aligned (0001) plane of the beta-phase group IV nitride on the (0001) plane of the group III nitride semiconductor, an interface with regularly arraned atoms can be efficiently obtained and, coupled with the strain effect in the atomic order, further modulation of band structure, improvement in the degree of freedom of device design, and reduction of discrepancies among devices can be achieved.

Next, the second example of the interface structure between GaN and the group IV nitride will be explained.

Figure 4:
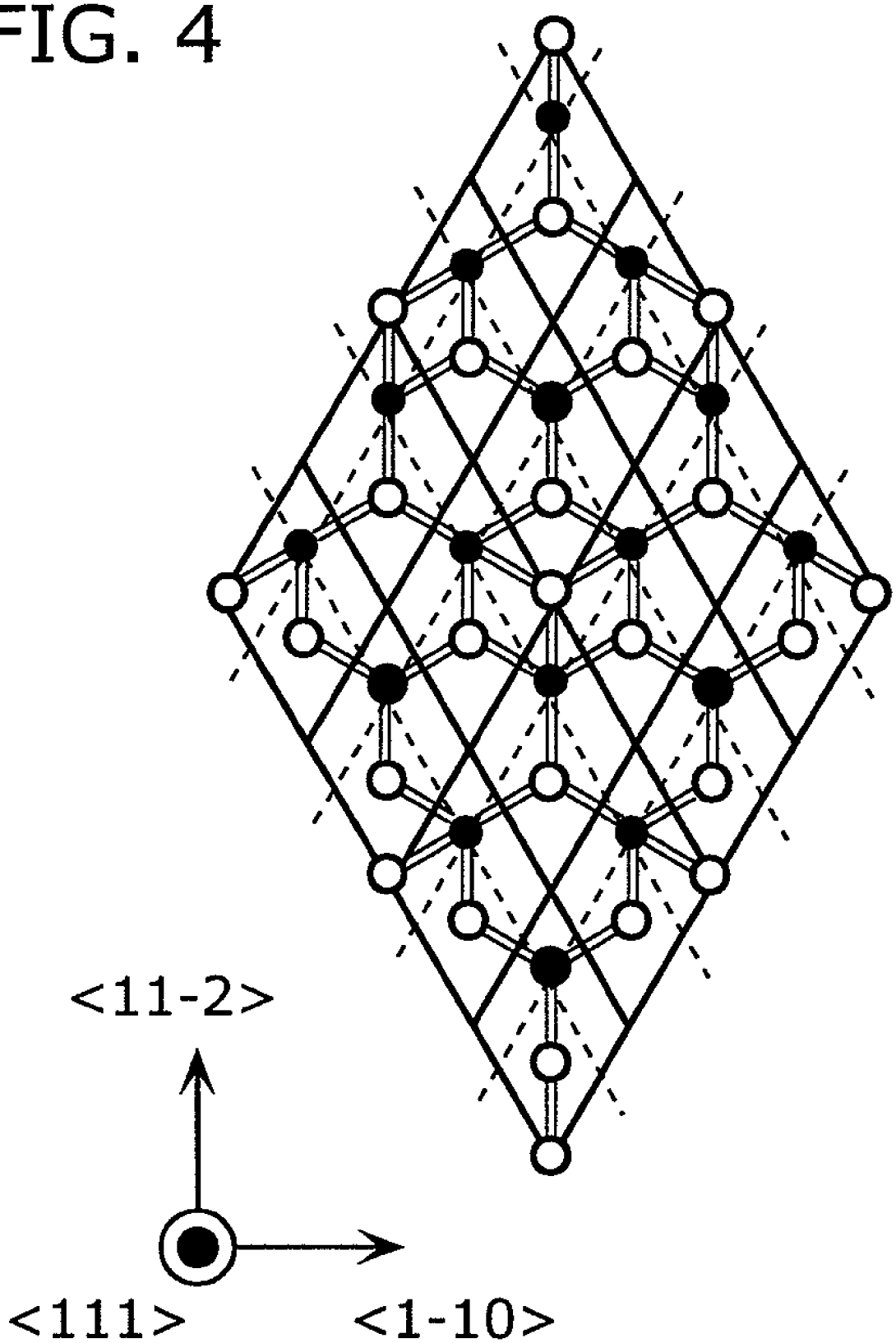
FIG. 4 is s diagram schematically showing the atomic arrangement of the (111) plane of the gamma-phase structure group IV nitride.

FIG. 4 is a diagram showing the atomic arrangement of the (111) plane of the group IV nitride taking the gamma-phase structure. In FIG. 4, the lattice constant of the group IV nitride is depicted as being four times that of the group III nitride semiconductor shown in FIG. 3A. In FIG. 4, a large circle indicates a group IV atom and a small circle shows a nitrogen atom. In particular, a black circle shows a nitrogen atom that exists in the bottom-most layer. Moreover, in FIG. 3A and FIG. 4, a diamond indicates a unit cell. The unit cell of the group IV nitride of the gamma-phase structure in FIG. 4 is conformed so as to be four times the unit cell of the group III nitride semiconductor in FIG. 3A. Moreover, in FIG. 4, the upward direction is assumed to be the <11-2> direction. In FIG. 3A, the connection with the group III atom on the top-most surface is indicated by broken lines, and the group III atom exists in the intersection of the broken lines. Moreover, the broken lines with the same spacing as in FIG. 3A are shown in FIG. 4, for comparison.

As shown in FIG. 4, it is understood that the bottom-most layer nitrogen atoms of the group IV nitride exist, on a one-to-one relation, in the intersection of the broken lines (corresponding to the location of the top-most surface group III atoms of the group III nitride semiconductor). In other words, when the group IV nitride shown in FIG. 4 is formed, by crystal growing, on the group III nitride semiconductor shown in FIG. 3A, a stable chemical bond without dangling bonda can be obtained in the interface between the group III nitride semiconductor and the group IV nitride. Thus, when (1) the lattice constant of the group IV nitride which has a the gamma-phase structure is approximately four times the lattice constant of the group III nitride semiconductor, (2) the group III nitride semiconductor has a (0001) plane of the wurtzite structure or (111) plane of the zinc-blende structure, and the plane direction of the group IV nitride is also the (111) plane, and (3) the in-plane direction of the interface of the group III nitride semiconductor is <11-20> in the case of the wurtzite structure and <11-2> in the case of the zinc-blende structure, and plane direction of the group IV nitride of the gamma-phase structure is also <11-2>, a consistent interface with no dangling bonds can be realized. Although a wurtzite structure is assumed in FIG. 3A, since the atomic arrangement of the upper-most surface of the (111) plane of the zinc-blende structure is exactly the same as the (0001) plane of the wurtzite structure, the effectiveness of the present invention can be sufficiently demonstrated even with the zinc-blende structure. Furthermore, the gamma-phase structure is also referred to as a spinel structure and, since ferromagnetism or antiferromagnetism can be achieved by introducing impurities such as a transition metal element into the group IV element, further high functionality can be achieved.

Next, the third example of an interface structure between GaN and the group IV nitride will be explained.

Figure 5B:
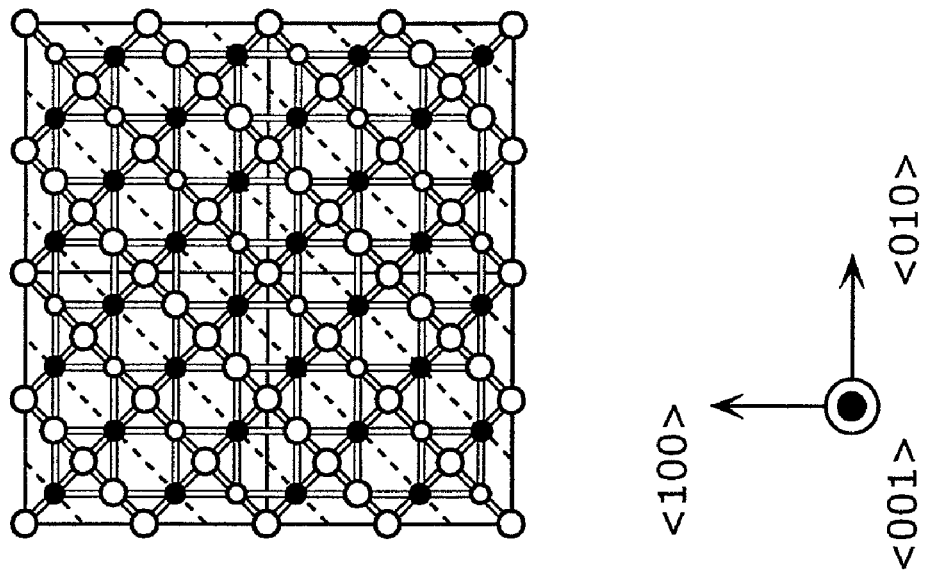
FIG. 5B is a diagram schematically showing the atomic arrangement of the (001) plane of the gamma-phase structure group IV nitride.
Figure 5A:
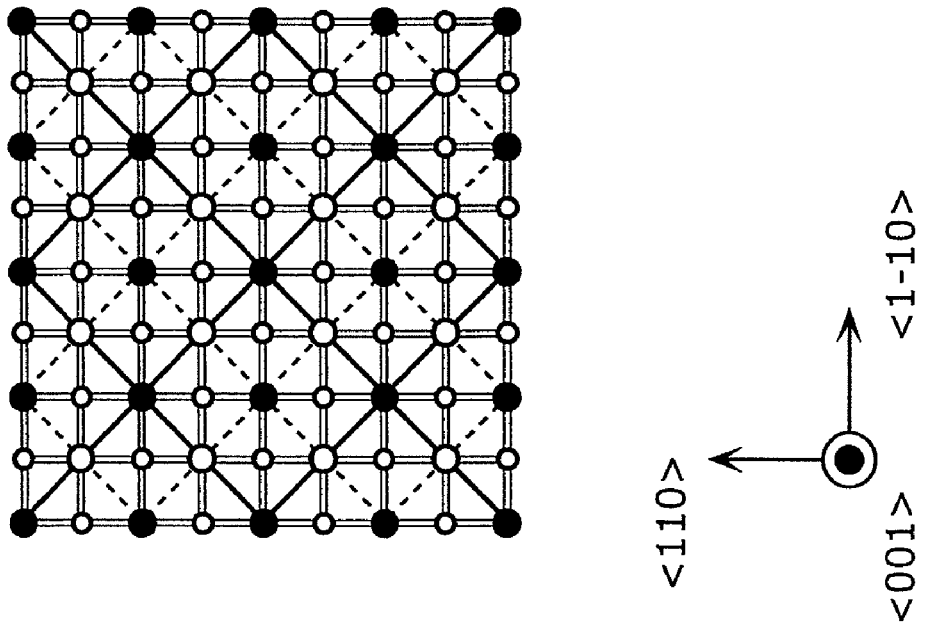
FIG. 5A is a diagram schematically showing the atomic arrangement of the (001) plane of the zinc-blende structure group III nitride semiconductor.

FIG. 5A is a diagram showing the atomic arrangement of the (001) plane of a group III nitride semiconductor having the zinc-blende structure. FIG. 5B is a diagram showing the atomic arrangement on the (001) plane of the group IV nitride that takes the gamma-phase structure. In FIG. 5A and FIG. 5B, the lattice constant of the group IV nitride is depicted as being equal to $\sqrt{2}$ times the lattice constant of the group III nitride semiconductor. Moreover, in FIG. 5A and FIG. 5B, the in-plane axis directions are shown mutually tilted by 45 degrees.

In FIG. 5A, a large black circle indicates a group III atom and a small white circle indicates a nitrogen atom. In particular, a large black circle indicates a group III atom that exists on the top-most surface. In FIG. 5B, a large circle indicates a group IV atom and a small circle indicates a nitrogen atom. In particular, a black circle indicates a nitrogen atom in the bottom-most layer. In FIG. 5A, a rectangle shown by solid lines indicates respective structures of unit cells. Moreover, solid lines and broken lines are lines connecting the group III atoms on the top-most surface of the group III nitride semiconductor. Moreover, the solid line and the dotted line of the same spacing as FIG. 5A are shown in FIG. 5B for comparing.

As shown in FIG. 5B, the bottom-most layer nitrogen atoms exists so as to correspondence to the upper-most surface group III atoms of the group III nitride semiconductor. Although the in-plane density of the bottom-most layer nitrogen atoms is high compared with that of the upper-most surface group III atoms, the structure can be stabilized through termination with hydrogen, and so on. Moreover, in FIG. 5B, when the lattice constant is made to be $\sqrt{2}$ times and tilted 45 degrees, a one-to-one correspondence to the top-most surface group III atoms of the group III nitride semiconductor in FIG. 5A is observed. Similarly, the same effect is also achieved when the lattice constant is made 1/$\sqrt{2}$ times and tilted 45 degrees. In this manner, when the group III nitride semiconductor takes the zinc-blende structure, the group III nitride semiconductor and the group IV nitride can form an excellent interface in various lattice constant ratios. Therefore, when the group IV nitride shown in FIG. 5B is formed, by crystal growing, on the group III nitride semiconductor shown in FIG. 5A, a stable chemical bond without dangling bonds can be obtained in the interface between the group III nitride semiconductor and the group IV nitride.

Next, the fourth example of an interface structure between GaN and the group IV nitride will be explained.

Figure 6B:
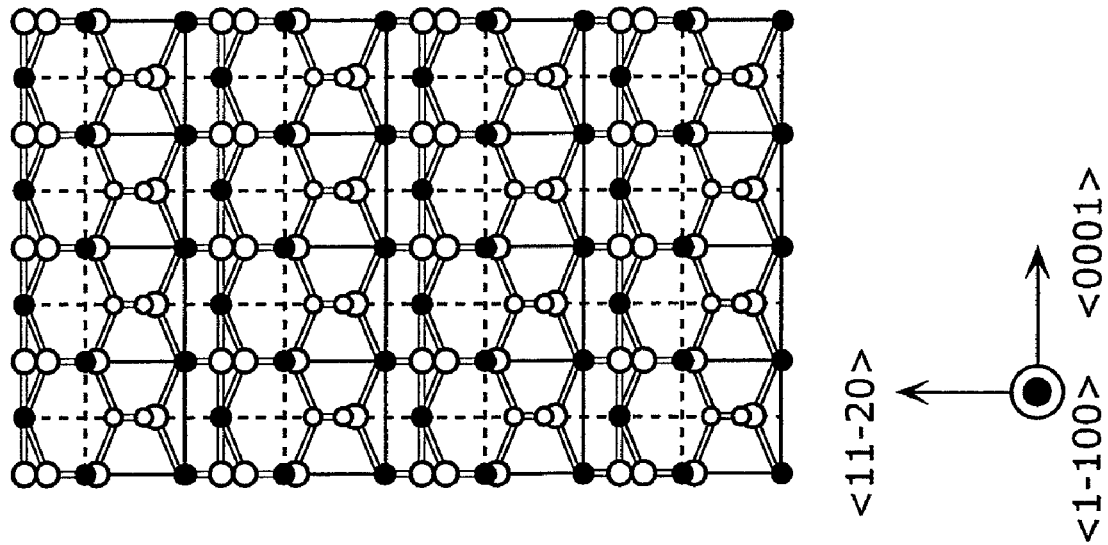
FIG. 6B is a diagram schematically showing the atomic arrangement of the (1-100) plane of the beta-phase structure group IV nitride.
Figure 6A:
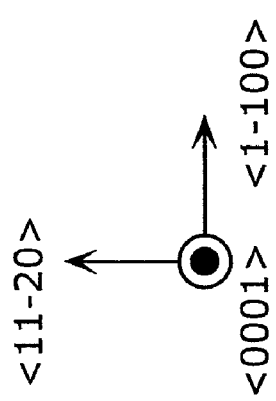
FIG. 6A is a diagram schematically showing the atomic arrangement of the (0001) plane of the wurtzite structure group III nitride semiconductor.

FIG. 6A is a diagram showing an atomic arrangement of the (0001) plane of the wurtzite group III nitride semiconductor (corresponding to the (111) plane of the zinc-blende structure). FIG. 6B is a diagram showing an atomic arrangement of the (1-100) plane of the group IV nitride that takes the beta-phase structure. In FIG. 6A and FIG. 6B, the lattice constant for the <0001> direction of the group IV nitride (horizontal direction in FIG. 6B) is depicted as being equal to the lattice constant in the in-plane direction of the group III nitride semiconductor. Moreover, in FIG. 6B, the vertical direction lattice constant is scaled down to about 70% compared to when the structure completely modified, for ease of comprehension. In FIG. 6A, a large black circle indicates a group III atom and a small white circle indicates a nitrogen atom. In particular, a large black circle indicates a group III atom that exists on the top-most surface. In FIG. 6B, a large circle indicates a group IV atom and a small circle indicates a nitrogen atom. In particular, a black circle indicates a nitrogen atom in the bottom-most layer. In FIG. 6A and FIG. 6B, a rectangle shown by solid lines indicates a unit in a periodic structure, and is equivalent to twice the area of the unit cell in the group III nitride semiconductor. Moreover, the upward direction is assumed to be the <11-20> direction in FIG. 6A, and the upward direction is assumed to be <11-20> direction in FIG. 6B. In other words, when the group IV nitride shown in FIG. 6B is formed on the group III nitride semiconductor shown in FIG. 6A, the <0001> direction of the group IV nitride becomes parallel to the interface between the group III nitride semiconductor and the group IV nitride. In FIG. 6A, a connection with the group III atom on the top-most surface is shown by broken lines, and the group III atom exists in the intersection of the broken lines. Moreover, broken lines of the same spacing as in FIG. 6A are shown in FIG. 6B, for comparison.

As shown in FIG. 6B, it can be seen that a part of the bottom-most layer nitrogen atoms perfectly matches with the top-most surface group III atoms of the group III nitride semiconductor. Moreover, although there are sections where the bottom-most layer nitrogen atoms do not exist in the intersection of the broken lines, in this case, since three nitrogen atoms exist in the periphery, the group III atoms on the top-most surface assume a octahedral configuration with the nitrogen atoms in the perimeter, and a stable chemical bond without dangling bonds is obtained. In FIG. 6B, although the vertical axis is scaled down for the explanation, this means that the present interface structure has a different strain for the vertical direction and the horizontal direction, and anisotropic in-plane stress can be imparted to the group III nitride semiconductor via the interface.

In this manner, when a crystal phase that is suitable for the lattice match condition of the group III nitride semiconductor base in the group IV nitride exists, the crystal structure can be uniquely selected automatically for crystallographic and thermodynamic reason. Moreover, according to this effect, in the interface between the group III nitride semiconductor and the group IV nitride, a regularly arranged structure with an excellent uniformity can be formed in self-organizing manner, and in particular, the formation of the interface state is best suppressed when the atom bond of the group III nitride semiconductor and the group IV nitride mutually bond on one-to-one basis. In addition, by selecting from carbon to lead as a group IV atom, a material ranging from a high-resistance insulator to a semi-metal can be obtained, and the strain-induced stress due the difference of the lattice constant can be imparted to the group III nitride semiconductor efficiently.

Note that although, in FIG. 3A and FIG. 6A, the group III nitride semiconductor was explained as the top-most surface of the (0001) plane of the wurtzite structure, the effectiveness of the present invention can be sufficiently demonstrated even with a top-most surface of the (111) plane of the zinc-blende structure. This is because, the atomic arrangement on the top-most surface is exactly the same for the (0001) plane of the wurtzite structure and the (111) plane of the zinc-blende structure. For the zinc-blende structure, it is sufficient to merely replace the in-plane <11-20> direction with the <11-2> direction.

Moreover, although the base group III nitride semiconductor was explained as being GaN in FIG. 2, the effectiveness of the present invention can be sufficiently demonstrated even with other group III nitride semiconductors. Although the lattice constant deviates from that of GaN when group III nitride semiconductors other than GaN is used, it is sufficient to merely change the composition of the group IV element and re-design the lattice constant of the group IV nitride accordingly.

Third Embodiment

In the third embodiment of the present invention, explanation will be carried out regarding a semiconductor element that enables, through a group IV nitride, in-plane anisotropy in the interface of the group III nitride semiconductor. Two examples of enabling in-plane anisotropy in the interface of the group III nitride semiconductor, through a group IV nitride will be explained as follows.

Figure 7A:
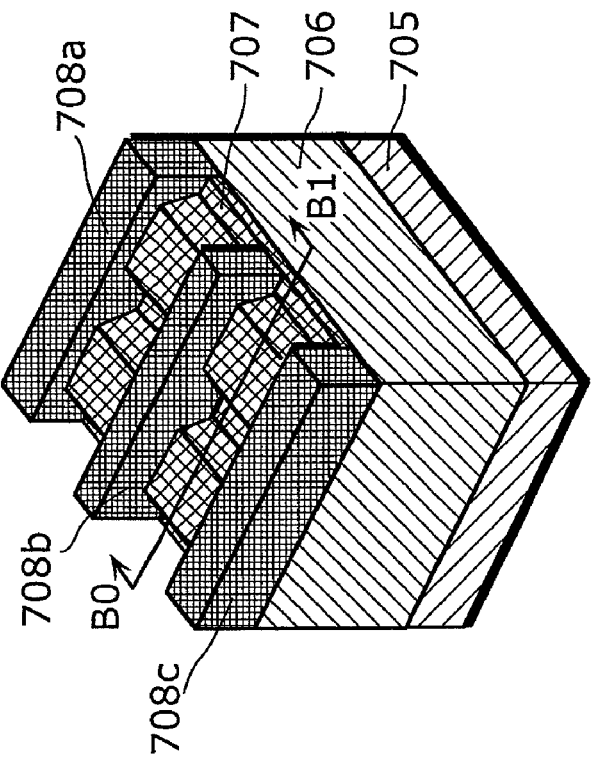
FIG. 7A is a perspective view showing the configuration of the semiconductor element according to the third embodiment of the present invention.

First, an example in which trench configurations are formed in the group III nitride semiconductor so as to enable anisotropy in the interface with the group IV nitride will be explained. FIG. 7A is a perspective view showing the structure of a field-effect transistor device in which trench configurations are formed in the group III nitride semiconductor so as to enable anisotropy in the interface with the group IV nitride. The field-effect transistor device shown in FIG. 7A includes a (0001) plane GaN substrate 701, an undoped GaN layer 702, a silicon nitride film 703, a source electrode 704a, a gate electrode 704b, and a drain electrode 704c.

The undoped GaN layer 702 is deposited on the GaN substrate 701. As for the undoped GaN layer 702, trenches are formed along the in-plane direction in the interface with the silicon nitride film 703, by chlorine-based dry etching.

The silicon nitride film 703 is deposited on the undoped GaN layer 702 by vapor deposition at 1100 degrees centigrade. Moreover, a gamma-phase crystal is formed in the interface between the silicon nitride film 703 and the undoped GaN layer 702. The interface between the silicon nitride film 703 and the undoped GaN layer 702 forms the interface structure depicted in FIG. 3A and FIG. 4.

In order to form an excellent contact with the undoped GaN layer 702, the source electrode 704a and the drain electrode 704c are vapor deposited in an area from which the silicon nitride film 703 is removed by methane reactive ion etching. The source electrode 704a is formed on the undoped GaN layer 702 which is the group III nitride semiconductor. The drain electrode 704c is formed on the undoped GaN layer 702, opposite the source electrode 704a. The gate electrode 704b is formed on the silicon nitride film 703 which is the group IV nitride, and between the source electrode 704a and the drain electrode 704c.

Figure 7C:
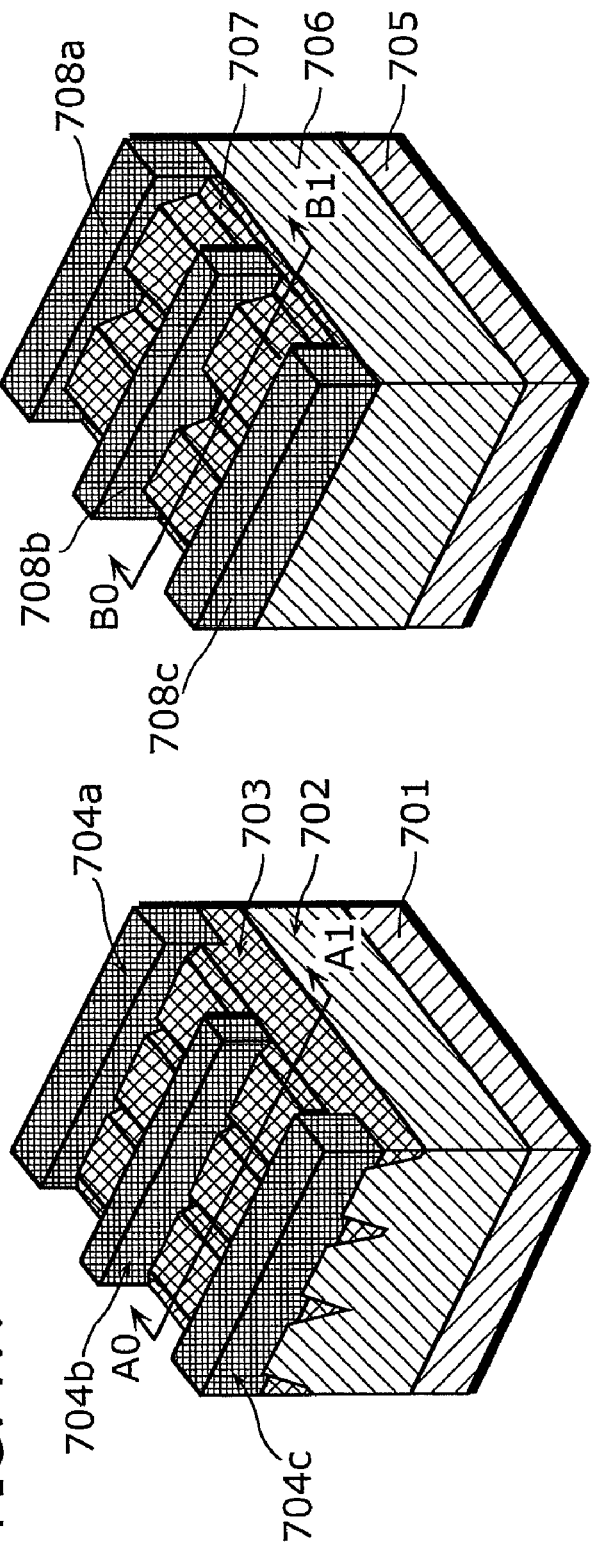
FIG. 7C is a perspective view showing the configuration of the semiconductor element according to the third embodiment of the present invention.
Figure 7B:
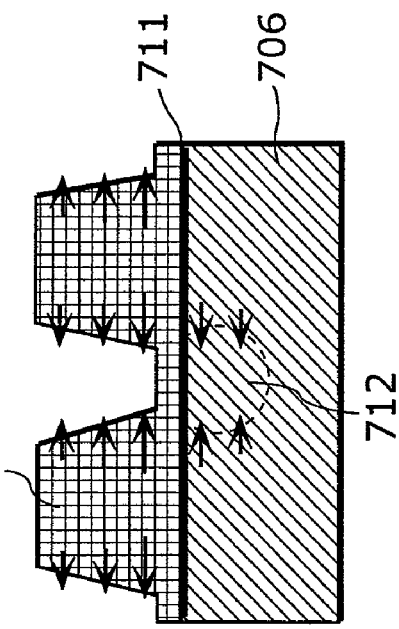
FIG. 7B is a diagram showing the cross-sectional configuration of the semiconductor element according to the third embodiment of the present invention.

FIG. 7B is a diagram showing a cross-sectional configuration of the undoped GaN layer 702 and the silicon nitride film 703 in A0-A1 of FIG. 7A.

In FIG. 7B, although the interface is formed between the undoped GaN layer 702 and the silicon nitride film 703, the trench portions are formed in a high index plane direction in the undoped GaN layer 702. Accordingly, an interface in which atoms are regularly arranged cannot be formed in surfaces other than the main surface. On the other hand, an interface 710 in which atoms are regularly arranged only in the main surface direction is formed in areas other than the trench portions in the interface between the undoped GaN layer 702 and the silicon nitride film 703. Here, since the silicon nitride film 703 is under compressive strain, strain-induced stress in the tensile direction is imparted to the undoped the base GaN layer 702 via the interface 710. Subsequently, since the trenches are formed in the undoped GaN layer 702, the undoped GaN layer 702 is drawn in a horizontal direction due to strain-induced stress, and subjected to compressive strain in the vertical direction. As a result, as for the undoped GaN layer 702, since the band edge of the conduction band can be lowered to the low energy side in the vicinity of the interface 710, a channel that allows electron transporting is formed in the vicinity of the interface 710. Since this channel allows the control of conductance through the application of voltage to the gate electrode 704b, the field-effect transistor device shown in FIG. 7A can be achieved.

Next, the example of enabling anisotropy in the interface by forming trenches in the group IV nitride on the group III nitride semiconductor will be explained.

FIG. 7C is a perspective view showing a configuration of the field-effect transistor device that enables anisotropy in the interface by forming trenches in the group IV nitride on the group III nitride semiconductor. The field-effect transistor device shown in FIG. 7C includes a (0001) plane GaN substrate 705, an undoped GaN layer 706, a silicon nitride film 707, a source electrode 708a, a gate electrode 708b, and a drain electrode 708c.

The undoped GaN layer 706 is deposited on the GaN substrate 705.

The silicon nitride film 707 is deposited on the undoped GaN layer 706 by vapor deposition at 1100 degrees centigrade. Subsequently, trenches are formed on the upper surface of the nitrogen silicon film 707 along the in-plane direction, by tetrafluoromethane-based reactive ion etching. Moreover, a gamma-phase crystal is formed in the interface between the silicon nitride film 707 and the undoped GaN layer 706. The interface between the silicon nitride film 707 and the undoped GaN layer 706 forms the interface structure depicted in FIG. 3A and FIG. 4.

In order to form an excellent contact with the undoped GaN layer 706 the source electrode 708a and the drain electrode 708c are vapor-deposited in the area from which the silicon nitride film 707 is removed by methane reactive ion etching.

Figure 7D:
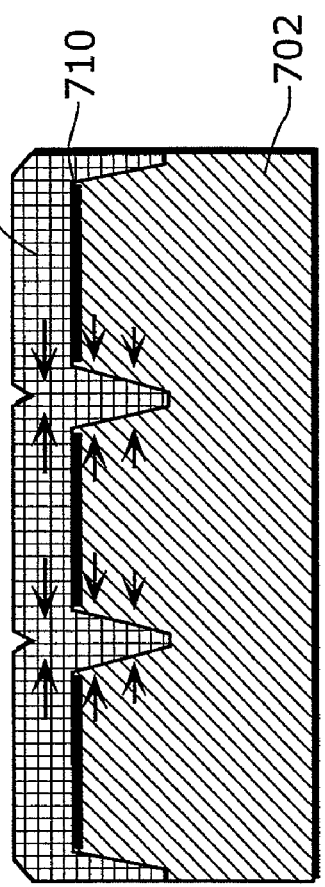
FIG. 7D is a diagram showing the cross-sectional configuration of the semiconductor element according to the third embodiment of the present invention.

FIG. 7D is a diagram showing a cross-sectional configuration of the undoped GaN layer 706 and the silicon nitride film 707 in B0-B1 of FIG. 7C.

As shown in FIG. 7D, an interface 711 in which atoms are regularly arranged is formed between the undoped GaN layer 706 and the silicon nitride film 707. Here, since the silicon nitride film 707 is under compressive strain, strain-induced stress in the tensile direction is imparted to the base undoped GaN layer 706 via the interface 711. In particular, since the protruding portions of silicon nitride film 707 is under heavy strain-induced stress, the undoped GaN layer 706 directly under the protruding portions is subjected to strain in the tensile direction with respect to the in-plane direction. On the other hand, the undoped GaN layer 706 directly under the concave portions is subjected to strain in the compression direction with respect to the in-plane direction. As such, in the undoped GaN layer 706, the band edge of the conduction band, directly under the protruding portions, can be lowered to the low energy side. Accordingly, a channel that enables electron transporting is formed in the vicinity of the interface 711. On the other hand, since the band is raised to the high energy side directly under the concave portion, depletion is caused in the undoped GaN layer 712 directly under the concave portions. As a result, a channel that allows movement of electrons in the vertical direction with respect to the illustration in FIG. 7B is formed. Since this channel allows the control of conductance through the application of voltage to the gate electrode 708b, the field-effect transistor device shown in FIG. 7C can be achieved.

Thus, the field-effect transistor device according to the third embodiment modulates the band of the group III nitride semiconductor via the interface, by modulating the shape of the group III nitride semiconductor or the group IV nitride in the in plane direction. Since stress having in-plane anisotropy modulates the adjacent atom intervals along a certain direction, the bond of the electron wave function in the conduction band and the valence band is anisotropically modulated. As a result, the electron mobility and the band structure can be modulated with respect to the in-plane direction, and the improvement of the frequency response characteristics of the electronic device can be achieved.

Moreover, the field-effect transistor device according to the third embodiment has the benefit in that the transistor structure can be constructed without requiring the heterostructure normally required in a transistor using a nitride semiconductor.

Although the silicon nitride film 707 shown in FIG. 7D also remains in the concave portion as a film, the effectiveness of the present invention can be sufficiently demonstrated even when the trench penetrates the silicon nitride film 707 up to the base undoped GaN layer 706. Moreover, although the silicon nitride films 703 and 707 are assumed to have the gamma-phase structure in FIG. 7A, FIG. 7B, FIG. 7C, and FIG. 7D, the effectiveness of the present invention can be sufficiently demonstrated even with the beta-phase structure. Moreover, in FIG. 7A and FIG. 7C, although the gate electrodes 704b and 708b are formed on the silicon nitride films 703 and 707 respectively, the effectiveness of the present invention can be demonstrated even when the silicon nitride film is removed and the gate electrodes 704b and 708b are in direct contact with the undoped GaN layer. In this case, it is preferable that the material of the gate electrodes 704b and 708b be a metal material that forms a Schottky contact with the undoped GaN layer.

Fourth Embodiment

In the fourth embodiment, a method for forming a low-resistance electrode contact layer by using the non-uniform strain distribution on a surface will be explained.

FIG. 8A is a cross-sectional drawing schematically showing a structure of a low-resistance p-type electrode contact layer which makes use of non-uniform strain distribution. The p-type electrode contact layer shown in FIG. 8A includes a p-type GaN layer 801, which is a group III nitride semiconductor, having a p-type conduction, a gamma-phase carbon nitride film 802 which is pattern processed on the p-type GaN layer 801, and an electrode material 803 formed on the p-type GaN layer 801 and the gamma-phase carbon nitride film 802. The p-type GaN layer 801 includes an area 801a having an interface with the gamma-phase carbon nitride film 802, and an area 801b that contacts directly with the electrode material 803 except the area 801a.

Since the lattice constant of gamma-phase carbon nitride film 802 is smaller compared to the lattice match condition with p type GaN layer 801, the gamma-phase carbon nitride film 802 is subjected to the stress in the tensile direction induced by the base p-type GaN layer area 801a. Moreover, after the gamma-phase carbon nitride film 802 is formed on the p-type GaN layer 801, the structure shown in FIG. 8A is formed by forming holes up to the interface with the p-type GaN layer 801 by pattern processing. The electrode material 803 is connected with the interface with the p-type GaN layer 801 through the holes formed in the gamma-phase carbon nitride film 802.

FIG. 8B is a diagram schematically showing the configuration of the vicinity of the interface with the group IV nitride (gamma-phase carbon nitride film) 802 and the GaN layer 801 in the p-type electrode contact layer shown in FIG. 8A. In FIG. 8B, the same reference numeral is given to a component that is the same as in FIG. 8A. Moreover, the arrows shown in FIG. 8B indicate the direction of the strain to which each material and area is subjected.

Since the lattice constant of the carbon nitride 802 is smaller compared to the lattice match condition of the carbon nitride 802 and the p-type GaN layer area 801a, the carbon nitride 802 imparts compressive strain in the in-plane direction to the base p-type GaN layer area 801a, in the direction of the arrows in the diagram. In response to the compressive strain imparted in the in-plane direction, the area 801a reduces internal energy by expanding in the vertical direction. Moreover, the compressive strain imparted to the area 801a induces tensile strain on the area 801b which does not have an interface with the carbon nitride 802. At this time, the area 801b contracts in the vertical direction in order to reduce internal energy. On the other hand, when the GaN layer 801 is an n-type and germanium nitride is used as the group IV nitride 802, tensile strain is imparted to the area 801a in the in-plane direction by the germanium nitride 802. The area 801b is subjected to a compressive biaxial strain in the in-plane direction, in the form of being dragged by the tensile strain imparted in the in-plane direction. In this manner, the group IV nitride 802 induces biaxial strain on the area 801b. Moreover, the biaxial strain occurs in the surface periphery.

FIG. 8C is a diagram showing the band structure in C0-C1 of FIG. 8B. In addition, FIG. 8C is a diagram showing the band structure when the GaN layer 801 is of a p-type and carbon nitride is used as the group IV nitride 802 in FIG. 8B. Moreover, in FIG. 8C, the left side is assumed to be the conductive material 803. Moreover, in FIG. 8C, the band structure when there is no strain is shown by broken lines. As shown in FIG. 8C, the conduction band and the valence band of p type GaN 801b are raised to the side where energy is high due to biaxial strain acting as a tensile strain in the in-plane direction. With the rasing effect caused by this strain, the top end of the valence band can be brought close to the Fermi level of the conductive material 803. Accordingly, the electric resistance between the p-type nitride semiconductor 801b and the conductive material 803 can be reduced, and the potential barrier can be decreased. With this mechanism, the electric contact resistance between the p-type nitride semiconductor 801b and the conductive material 803 can be reduced by using the pattern processed group IV nitride 802.

Note that, this method is a method that is also effective in the reduction of contact resistance between the electrode and the n-type nitride semiconductor. At this time, it is sufficient to merely replace the p-type GaN layer 801 in the above-mentioned explanation with the n-type GaN layer, and replace the carbon nitride 802 with germanium nitride which has a higher lattice constant compared to the lattice match condition in the n-type GaN layer 801. Since the direction of the strain distribution in the in-plane direction in FIG. 8B are all reversed when the n-type GaN layer 801 and the germanium nitride 802 are used, all arrows in FIG. 8B will indicate opposite directions. FIG. 8D is a diagram schematically showing the band structure in C0-C1 of FIG. 8B when the n-type GaN layer 801 and the germanium nitride 802 are used. Since the surface of the area 801b of the n-type GaN layer is subjected to compressive biaxial strain in the in-plane direction, the conduction band and the valence band of n-type GaN 801b shift downward in terms of energy with respect to the band structure when there is no strain indicated by the broken lines, as shown in FIG. 8D. Accordingly, the lower end of the conduction band can be brought close to the vicinity of the Fermi level of the conductive material 803. Accordingly, the reduction of electric resistance between the n-type nitride semiconductor 801b and the conductive material 803, and the decrease of the potential barrier can be achieved.

Although 801 is depicted as a monolayer in FIG. 8A and FIG. 8B, the effectiveness of the present invention can be demonstrated even with a heterostructure.

Thus, by introducing, in a device, the technique in the present embodiment for pattern processing the group IV nitride and setting the conductive material, low electric resistance can be achieved, and improvement of reliability by low power consumption and reduction of the heat release value of elements can be achieved. For example, by using the technique of the fourth embodiment, it is possible to reduce the electric resistance between each of the gate electrode, source electrode, and drain electrode of the field-effect transistor and the nitride semiconductor layer shown in FIG. 1D, FIG. 7A, and FIG. 7C.

Fifth Embodiment

In the nitride semiconductor material according to the fifth embodiment, a group IV nitride having a changed group IV element composition is formed on the group IV nitride of the nitride semiconductor material having an interface with regularly arranged atoms described above. Accordingly, the strain-induced stress on the group III nitride of the nitride semiconductor material can be controlled.

Figure 9A:
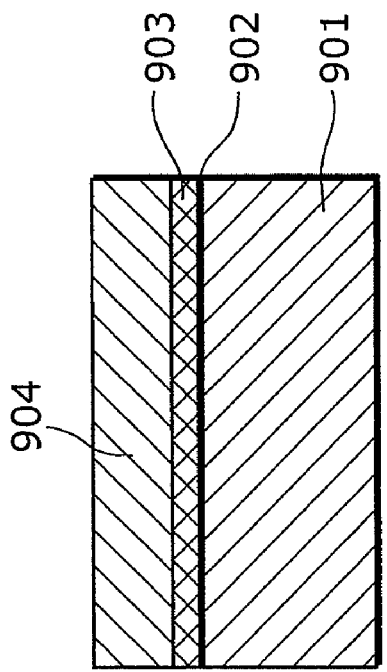
FIG. 9A is a diagram schematically showing the cross-sectional configuration of the nitride semiconductor material according to the fifth embodiment of the present invention.

FIG. 9A is a diagram schematically showing a cross-sectional configuration of a semiconductor element in the case where the composition of the group IV element of the group IV nitride is successively changed. The semiconductor element shown in FIG. 9A includes a (0001) plane GaN 901, a gamma-phase tin nitride film 903 formed on the (0001) plane GaN 901 via an interface 902 having regularly arranged atoms, and a group IV nitride film 904 formed on the gamma-phase tin nitride film 903. The group IV nitride film 904 has a composition which is different from the gamma-phase tin nitride film 903, and such composition changes in the upward direction with respect to the illustration. Moreover, the gamma-phase tin nitride film 903 is formed with a group IV element composition that does not impart strain-induced stress to the GaN 901 in the interface 902. Moreover, the composition of the group IV nitride film 904 is modulated to impart strain-induced stress in the vertical direction to the interface 902.

Figure 9B:
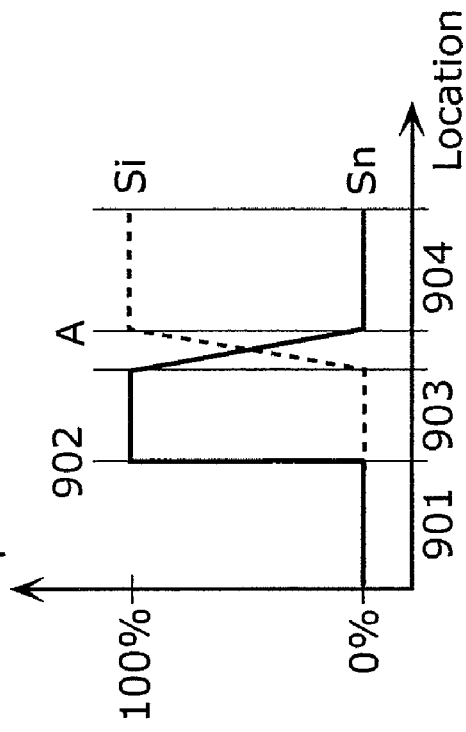
FIG. 9B is a diagram schematically showing the composition distribution of the group IV element of the nitride semiconductor material according to the fifth embodiment of the present invention.

FIG. 9B is a diagram showing the distribution of the composition change of the group IV nitride film 904. As shown in FIG. 9B, the tin content decreases from 100% from the interface between the tin nitride film 903 and the group IV nitride film 904, becoming 0% at a point A. On the other hand, the silicon content is 0% in the interface between the tin nitride film 903 and the group IV nitride film 904, becoming 100% at point A. Moreover, the total content of the group IV element for the group IV nitride film 904 is 100% for all, and this satisfies stoichiometry condition 3:4 of the group IV nitride.

First, as shown in FIG. 2, the lattice constant (about 12.8 angstrom) of the gamma-phase tin nitride (gamma-$Sn_3N_4$) approximately matches four times the lattice constant (about 3.2 angstrom) of GaN. That is, in the interface 902 of the GaN layer 901 and the gamma-phase tin nitride film 903, the group III atom on the group III nitride semiconductor side and the nitrogen atom on the group IV nitride side can form an ideal one-to-one chemical bond, as previously shown in FIG. 3A and FIG. 4. As such, the interface 902 becomes an ideal interface that does not include any interface state at all. During film deposition, in particular, since the gamma-phase tin nitride film 903 matches the lattice constant, it is not subjected to any disturbance due to the strain from the GaN layer 901. Accordingly, compared to the environment under strain-induced stress, such an ideal interface can be easily formed. In addition, when depositing from the gamma-phase tin nitride film 903 to the group IV nitride film 904 thereon, group IV nitride with differing lattice constants can be deposited with minimal defects while maintaining the same crystal structure by successively changing the composition from the gamma-phase tin nitride.

Figure 9C:
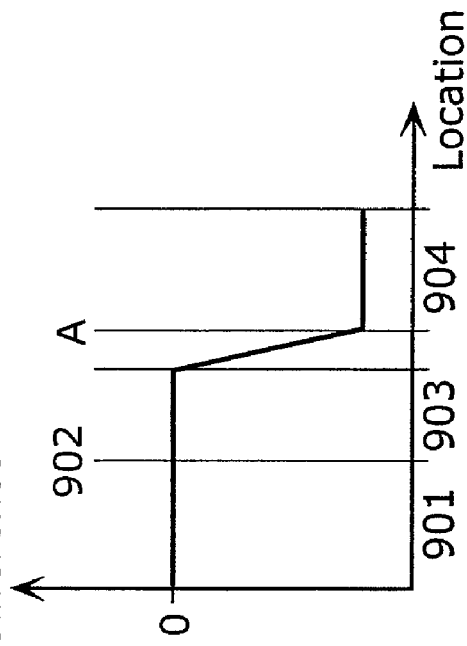
FIG. 9C is a diagram schematically showing the difference of the lattice constant of the nitride semiconductor material according to the fifth embodiment of the present invention.

FIG. 9C is a diagram showing the difference of the lattice constants for GaN when the composition is successively changed from the gamma-phase tin nitride film 903 as shown in FIG. 9A to a gamma-phase silicon nitride. As shown in FIG. 9C, although the gamma-phase tin nitride film 903 is deposited with a lattice approximately conforming to the base GaN layer 901, the tin content decreases and the silicon content increases as the distance from the interface increases, and thus, the lattice constant decreases gradually compared with the gamma-phase tin nitride. In addition, at the point A where all the tin is replaced by silicon, the gamma-phase tin nitride becomes a gamma-phase silicon nitride. The large strain-induced stress originating from the reduction of the lattice constant is imparted to the GaN layer 901 via the gamma-phase tin nitride film 903 and the interface 902.

By introducing the present method to the silicon nitride film 106 of the heterojunction field-effect transistor shown in FIG. 1D, strain-induced stress can be efficiently imparted to the group III nitride semiconductor through the composition-ally modulated group IV nitride film on the gamma-phase tin nitride film, while realizing the ideal interface with regularly arranged atoms through the lattice conforming gamma-phase tin nitride film. Accordingly, the controlling of variances in characteristics by increasing the carrier density of the device and reducing the interface state, and the improvement of reliability, can be achieved.

Although the group IV element composition of the group IV nitride film 904 is successively changed in the present embodiment, the composition of the group IV element can also be changed drastically as long as the crystal structure can be maintained. Moreover, although description is carried out using tin and silicon as group IV elements in the above-mentioned explanation, any combination may be used as long as they are group IV elements. Moreover, since the lattice constant of the group IV nitride can be changed over a wide range by using materials from carbon to lead as the group IV element, deposition under distortion-free conditions is possible for various group III nitride semiconductor lattice constants.

Sixth Embodiment

In embodiment 6, the nitride semiconductor material to make the group IV nitride a sandwich structure using the group III nitride semiconductor will be explained.

Figure 10A:
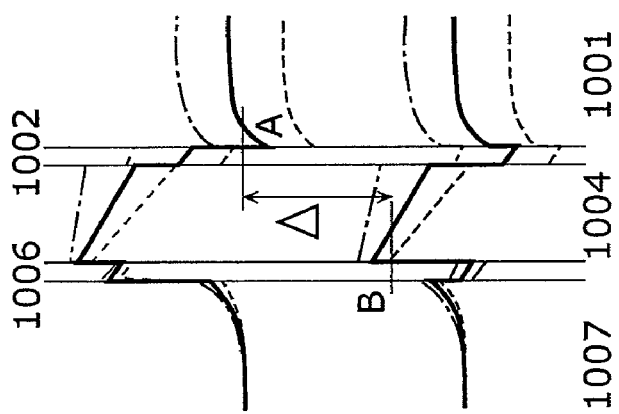
FIG. 10A is a diagram schematically showing the cross-sectional configuration of the semiconductor element according to the sixth embodiment of the present invention.

FIG. 10A is a diagram schematically showing the cross-sectional configuration of the nitride semiconductor material to make the group IV nitride a sandwich structure using the group III nitride semiconductor. The nitride semiconductor material shown in FIG. 10A includes a GaN layer 1001, an AlN layer 1002 formed on the GaN layer 1001, a gamma-phase silicon nitride thin film 1004 of 5 nm in thickness formed on the AlN layer 1002 via an interface 1003, an AlN layer 1006 formed on the gamma-phase silicon nitride thin film 1004 via an interface 1005, and a GaN layer 1007 formed on the AlN layer 1006.

The lower interface 1003 and the upper interface 1005 are formed with the regular atomic arrangement shown in FIG. 3A and FIG. 4. The lower interface 1003 is an interface of (111) plane of gamma-phase silicon nitride/(0001) plane of wurtzite AlN, and the upper interface 1005 is an interface of (0001) plane of wurtzite AlN/(111) plane of gamma-phase silicon nitride. The lower interface 1003 and the upper interface 1005 are interface structures in which atoms are regularly arranged and in a one-to-one chemical bond. That is, considerations are taken for the lower interface 1003 and the upper interface 1005 so that the interface state is reduced as much as possible.

The gamma-phase silicon nitride 1004 is deposited by the MOCVD method, and the deposition temperature is 1100 degrees centigrade, and the cracking of the raw material with plasma is not performed.

The relation of the lattice constant between the gamma-phase silicon nitride and the GaN shifts greatly compared with four times the lattice constant of the GaN as shown in the graph of the relation between the lattice constant and the band gap in FIG. 2, and a large tensile strain of about 15% is imparted on the gamma-phase silicon nitride thin film in the interface. Moreover, compressive strain is also imparted to the AlN near the interface 1003 and 1005. When implementing the sandwich structure shown in FIG. 10A, a method of deposition without extraction from the furnace, using integrated growing by an MOCVD apparatus is suitable. By using the method of deposition without extraction from the furnace, mixing-in of impurities such as oxygen can be kept to a minimum and irregularities in the interface caused by impurities can be suppressed.

The band gap of gamma-phase silicon nitride (gamma-$Si_3N_4$) is about 4.4 eV, as shown in the relation between the lattice constant and the band gap in FIG. 2. Moreover, as a result of first principle calculation, our research reveals that GaN and gamma-phase silicon nitride form a type II heterojunction. As a result of the calculation, the conduction band of the gamma-phase silicon nitride is located above by about 2 eV with respect to the conduction band of GaN. Moreover, the valence band of the gamma-phase silicon nitride is located above about 1 eV with respect to the valence band of the GaN.

Figure 10B:
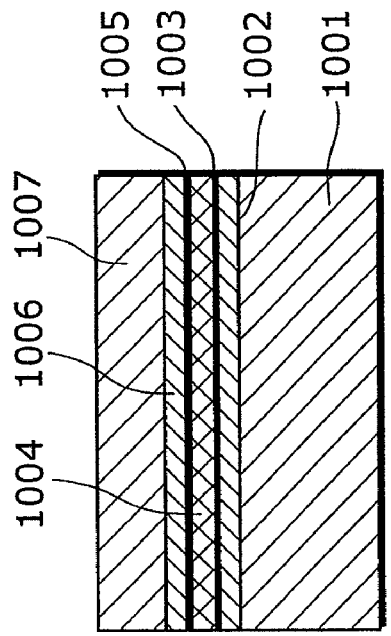
FIG. 10B is a diagram schematically showing the band structure of the semiconductor element according to the sixth embodiment of the present invention.

FIG. 10B is a diagram showing the band structure from the GaN layer 1001 to the GaN layer 1007 sandwiching the gamma-phase silicon nitride thin film 1004 of the nitride semiconductor material shown in FIG. 10A. In addition, in FIG. 10B, the same reference numeral is given to the same component as in FIG. 10A. As shown in FIG. 10B, since the band inclines sharply due to strain and carrier bias, the gamma-phase silicon nitride thin film 1004, the GaN layers 1001 and 1007 in the vicinity of the interface, and the AlN layers 1002 and 1006, assume the band chart indicated by solid lines in FIG. 10B. With the piezoelectric effect due to the strain shown in FIG. 10B, electric charge is generated in the interfaces 1003 and 1005 of the gamma-phase silicon nitride thin films 1004. Electrons which are negative electric charges are accumulated in the vicinity of the interface 1003, and electron holes which are positive electric charges are accumulated in the vicinity of the interface 1005. Moreover, since a type II heterointerface is formed for GaN, AlN and the gamma-phase silicon nitride, electrons are accumulated, in the lower interface 1003, on the GaN layer 1001-side where the conduction band energy is lowered most, and electron holes are accumulated, in the upper interface 1005, on the gamma-phase silicon nitride thin film 1004-side. In FIG. 10B, the location where the electrons are accumulated is indicated as A, and the location where the electron holes are accumulated is indicated as B. Here, the energy difference between A and B (indicated as Δ in FIG. 10B) obtains a value which is smaller than the band gap of any of AlN, GaN, and the gamma-phase silicon nitride. In this case, energy difference Δ is about 2 eV. In addition, it is an important point that the energy difference Δ can be controlled by the application of electric voltage. Moreover, the broken lines shown in FIG. 10B is a band chart when electric voltage where the left side of FIG. 10B positive is applied. The alternate long and short dash lines shown in FIG. 10B is a band chart when the electric voltage where the left side of FIG. 10B becomes negative is applied. As shown by the broken lines and the alternate long and short dash lines in FIG. 10B, the energy difference Δ between A and B changes with the application of voltage. The energy difference Δ decreases with the application of positive voltage and the energy difference Δ increases with the application of negative voltage. Thus, by changing the energy difference Δ by voltage application, the absorption coefficient and the absorption wavelength edge of the sandwich structure can be drastically changed.

Figure 10C:
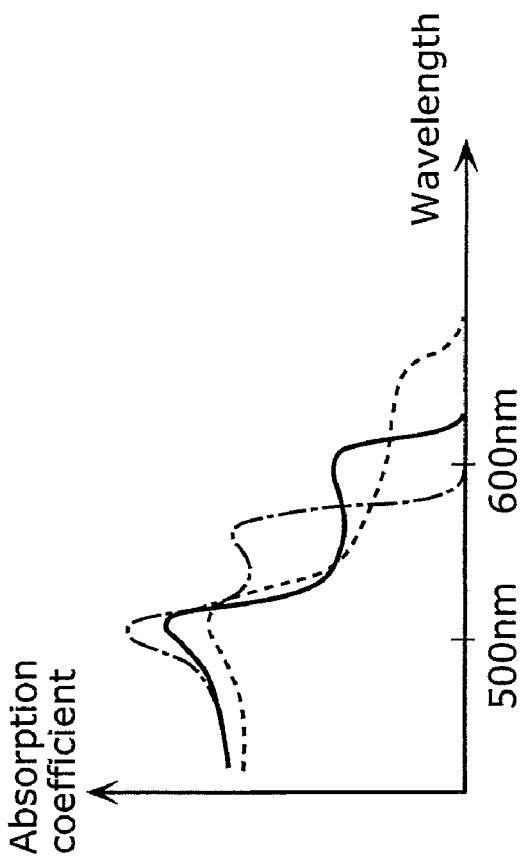
FIG. 10C is a diagram schematically showing optical absorption spectra of the semiconductor element according to the sixth embodiment of the present invention.

FIG. 10C is a diagram schematically showing the change in the absorption coefficient spectrum for each applied voltage. In FIG. 10C, the solid line shows the absorption coefficient spectrum when voltage is not applied, the dotted line shows the absorption coefficient spectrum when positive voltage is applied, and the alternate long and short dash line shows the absorption coefficient spectrum when negative voltage is applied. As shown in FIG. 10C, a large absorption band exists near the wavelength 500 nm. This is bulk optical absorption by the conduction band of GaN and the valence band of the gamma-phase silicon nitride. The subpeak that exists in the long-wavelength side from the wavelength 500 nm is an absorption spectrum controlled by the applied voltage, and it has an absorption edge around about 600 nm when voltage is not applied. With the application of positive bias voltage, the absorption edge wavelength shifts to the long-wavelength side, as shown by the broken line. On the other hand, with the application of negative bias voltage, the adsorption edge wavelength shifts to the short-wavelength side, as shown by the alternate long and short dash line. If this principle is used, an active wavelength filter element in which color controlling is possible through voltage application can be easily achieved. In the example of the implementation shown by FIG. 10C, coloring can be changed from orange, through red, to black (nontransparent) by voltage application.

As mentioned above, by using the nitride semiconductor material according to the present invention, it is possible to realize a type II heterostructure having large discontinuity, that could not be realized in the group III nitride semiconductor up to now, can be achieved. Therefore, by using the nitride semiconductor material according to the present invention, constructing a device of new functionality becomes possible, and an inexpensive and efficient display apparatus and optical modulator, etc. can be achieved.

Note that, in the above-mentioned structure, the variable range is from 0 eV to 2.4 eV which corresponds to green. However, by selecting the material composition of the GaN layers 1001 and 1007 and the gamma-phase silicon nitride thin film 1004 so that the band gap is widened, an active wavelength filter element, which enables voltage control of all visible wavelength regions up to violet (about 3 eV), can be realized. In addition, although the silicon nitride was discussed here as a gamma-phase structure, a (0001) plane of beta-phase structure which can likewise reduce interface state is also possible. Moreover, in the case where a group III nitride semiconductor having a composition which contains 50% or more of aluminum is used instead of the GaN layers 1001 and 1007, both the AlN layers 1002 and 1006, which contact the silicon nitride film 1004, are not necessarily required. This is because a high aluminum-composition group III nitride semiconductor can form a high-quality interface with silicon nitride. In addition, even if with a group III nitride semiconductor that does not contain aluminum, both the AlN layers 1002 and 1006 are not necessarily required, as long as an excellent interface with the silicon nitride can be formed. Moreover, even when the AlN layers 1002 and 1006 contain gallium or indium, the effectiveness of the present invention can still be sufficiently demonstrated.

Moreover, although description is carried out using a gamma-phase silicon nitride thin film subjected to tensile strain in the above-mentioned explanation, the effectiveness of the present invention can still be demonstrated even with a material composition in which a group IV nitride thin film is subjected to compressive strain. Here, although the thickness of the gamma-phase silicon nitride thin film 1004 is described being 5 nm, as long as thickness is up to 10 nm, it can still function sufficiently as an active wavelength filter element since the overlapping in the wave function of electrons and electron holes is large.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention can be applied to a nitride semiconductor material, a semiconductor element, and a manufacturing method thereof, and particularly to a high output high frequency semiconductor device such as a GaN-based heterojunction transistor.

What is claimed is:

1. A nitride semiconductor material comprising:
a group III nitride semiconductor; and
a group IV nitride formed on said group III nitride semiconductor, wherein
an interface between said group III nitride semiconductor and said group IV nitride has a regular atomic arrangement;
in said group III nitride semiconductor, an electrical conduction is a p-type;
a lattice constant of said group IV nitride is small compared to a lattice match condition with said group III nitride semiconductor;
in said group IV nitride, a hole which reaches the interface is formed; and
said nitride semiconductor material further includes a conductive material connected with the interface via the hole.

2. The nitride semiconductor material according to claim 1, wherein an arrangement of nitrogen atoms of said group IV nitride in the interface and an arrangement of group III atoms of said group III nitride semiconductor in the interface are substantially identical.

3. The nitride semiconductor material according to claim 1, wherein said group IV nitride semiconductor has a beta-phase or a gamma-phase crystal structure in the interface.

4. The nitride semiconductor material according to claim 1, wherein said group III nitride semiconductor has a (0001) plane of a wurtzite structure or a (111) plane of a zinc-blende structure in the interface,
said group IV nitride has a (0001) plane of a beta-phase crystal structure in the interface,
a <11-20>direction of the (0001) plane of the wurtzite structure or a <11-2>direction of the (111) plane of the zinc-blende structure of said group III nitride semiconductor matches with a <11-20>direction of the (0001) plane of the beta-phase crystal structure of said group IV nitride, and
a lattice constant of said group IV nitride is roughly twice a lattice constant of said group III nitride semiconductor.

5. The nitride semiconductor material according to claim 1, wherein said group III nitride semiconductor has a (0001) plane of a wurtzite structure or a (111) plane of a zinc-blende structure in the interface,
said group IV nitride has a (111) plane of a gamma-phase crystal structure in the interface,
a <11-20>direction of the (0001) plane of the wurtzite structure or a <11-2>direction of the (111) plane of the zinc-blende structure of said group III nitride semiconductor matches with a <11-2>direction of the (111) plane of the gamma-phase crystal structure of said group IV nitride, and
a lattice constant of said group IV nitride is roughly four times a lattice constant of said group III nitride semiconductor.

6. The nitride semiconductor material according to claim 1 wherein said group III nitride semiconductor has a (001) plane of the zinc-blende structure in the interface, and
said group IV nitride has a (001) plane of the gamma-phase crystal structure in the interface.

7. The nitride semiconductor material according to claim 1, wherein said group III nitride semiconductor has a (0001) plane of a wurtzite structure or a (111) plane of a zinc-blende structure in the interface,
said group IV nitride has a (1-100) plane of a beta-phase crystal structure in the interface, and
a <0001>direction of said group IV nitride in the interface is parallel to the interface.

8. The nitride semiconductor material according to claim 1, wherein said group III nitride semiconductor includes:
a first layer made of gallium nitride; and
a second layer formed on said first layer, and made of a group III nitride semiconductor having a wide band gap compared to gallium nitride, and said group IV nitride is formed on said second layer.

9. The nitride semiconductor material according to claim 1, wherein, in said group III nitride semiconductor, a trench is formed along an in-plane direction in the interface.

10. The nitride semiconductor material according to claim 1, wherein a trench is formed on a top surface of said group IV nitride, along an in-plane direction.

11. The nitride semiconductor material according to claim 1, further comprising
    a second group IV nitride formed on said group IV nitride, which is different in composition from said group IV nitride.

12. The nitride semiconductor material according to claim 11, wherein said group IV nitride is formed with a composition of a group IV element that does not impart strain-induced stress on said group III nitride semiconductor in the interface, and
    in said second group IV nitride, the composition is modulated to impart strain-induced stress on the interface in a vertical direction.

13. The nitride semiconductor material according to claim 1, wherein, said group IV nitride contains a group IV element and nitrogen in a 3:4 ratio, and having a margin of error that is within 10 percent for composition of the group IV element and the nitrogen.

14. The nitride semiconductor material according to claim 1, wherein said group IV nitride contains hydrogen.

15. The nitride semiconductor material according to claim 1, wherein said group IV nitride semiconductor has a regular atomic arrangement throughout a whole area of said group IV nitride semiconductor.

16. The nitride semiconductor material according to claim 1, further comprising a second group III nitride semiconductor formed on said group IV nitride,
    wherein an interface between said second group III nitride semiconductor and said group IV nitride has a regular atomic arrangement.

* * * * *